(12) United States Patent
Esteves et al.

(10) Patent No.: US 12,034,050 B1
(45) Date of Patent: Jul. 9, 2024

(54) CMOS COMPATIBLE LOW-RESISTIVITY Al—Sc METAL ETCH STOP

(71) Applicant: National Technology & Engineering Solutions of Sandia, LLC, Albuquerque, NM (US)

(72) Inventors: Giovanni Esteves, Albuquerque, NM (US); Travis Ryan Young, Albuquerque, NM (US)

(73) Assignee: National Technology & Engineering Solutions of Sandia, LLC, Albuquerque, NM (US)

(*) Notice: Subject to any disclaimer, the term of this patent is extended or adjusted under 35 U.S.C. 154(b) by 561 days.

(21) Appl. No.: 17/391,415

(22) Filed: Aug. 2, 2021

Related U.S. Application Data

(60) Provisional application No. 63/069,406, filed on Aug. 24, 2020.

(51) Int. Cl.
  *H01L 29/20* (2006.01)
  *H01L 21/033* (2006.01)
  *H01L 21/306* (2006.01)

(52) U.S. Cl.
  CPC ...... *H01L 29/2003* (2013.01); *H01L 21/0332* (2013.01); *H01L 21/30612* (2013.01); *Y10T 428/12764* (2015.01)

(58) Field of Classification Search
  None
  See application file for complete search history.

(56) References Cited

U.S. PATENT DOCUMENTS

| | | | | |
|---|---|---|---|---|
| 6,329,275 | B1 * | 12/2001 | Ishigami | C23C 14/3414 438/584 |
| 2002/0020875 | A1 * | 2/2002 | Arao | H01L 27/1288 257/E29.151 |

(Continued)

OTHER PUBLICATIONS

Marquis et al., "Nanoscale Structural Evolution of Al3Sc Precipitates in Al(Sc) Alloys", 2001, Acta Materialia, vol. 49, pp. 1909-1919 (Year: 2001).*

(Continued)

*Primary Examiner* — Seth Dumbris
(74) *Attorney, Agent, or Firm* — Mark A. Dodd

(57) ABSTRACT

An aluminum-scandium (Al—Sc) etch stop that is both CMOS compatible and highly conductive, and a method for forming the same are disclosed. The low volatility of Sc in Cl and strong covalent bond between Al—Sc leads to an increase in resistance to NaCl corrosion and makes it difficult to dry etch in Cl-based chemistries, resulting in an excellent etch stop material, especially when used in conjunction with an overlying aluminum nitride (AlN) or aluminum scandium nitride (AlScN) piezoelectric layer. When deposited at high deposition temperatures or when subsequently annealed at >600° C., the Al—Sc has a low resistivity, enabling corresponding device operation at temperatures up to at least 500° C. While $Al_3Sc$ is the preferred composition, $Al_{1-x}Sc_x$ with x between 5 and 100 atomic percent provides many of these same benefits but comes at the cost of increased electrical resistivity and etch resistance with increasing Sc content due to Sc oxidation.

15 Claims, 14 Drawing Sheets

(56) References Cited

U.S. PATENT DOCUMENTS

2015/0084719 A1* 3/2015 Umeda .............. H03H 9/02086 333/187
2020/0036359 A1* 1/2020 Shin ..................... H10N 30/877

OTHER PUBLICATIONS

Asta, M. et al., "Structural, vibrational, and thermodynamic properties of Al—Sc alloys and intermetallic compounds," Physical Review B (2001) 64:094104-1-094104-14.

Cavanaugh, M. K. et al., "Investigating localized corrosion susceptibility arising from Sc containing intermetallic Al3Sc in high strength Al-alloys," Scripta Materialia (2007) 56:995-998.

Chen, D. et al., "The Effect of Alloying Elements on the Structural Stability, and Mechanical and Electronic Properties of Al3Sc: A First-Principles Study," Materials (2019) 12:1539, 13 pages.

Colvin, R. V. et al., "Electrical Resistivity of Scandium," Journal of Applied Physics (1963) 34(2):286-290.

Esteves, G. et al., "CMOS compatible metal stacks for suppression of secondary grains in Sc0.125Al0.875N," J. Vac. Sci. Technol. A (2019) 37(2):021511-1-021511-8.

Harada, Y. et al., "Thermal expansion of Al3Sc and Al3(Sc0.75X0.25)," Scripta Materialia (2003) 48:219-222.

Henry, M. D. et al., "ScAlN etch mask for highly selective silicon etching," J. Vac. Sci. Technol. B. (2017) 35(5):052001-1-052001-6.

Lee, S.-L. et al., "Effects of scandium addition on electrical resistivity and formation of thermal hillocks in aluminum thin films," Thin Solid Films (2011) 519:3578-3581.

Liao, H.-L. et al., "On the characterization of Al-0.11 wt.%Sc alloy thin film," Thin Solid Films (2009) 517:4867-4870.

Royset, J. et al., "Scandium in aluminum alloys," International Materials Reviews (2005) 50(1):19-44.

Spedding, F. H. et al., "The Resistivity of Scandium single Crystals," Journal of the Less-Common Metals (1971) 23:263-270.

Yingjun, G. et al., "Atomic Bonding and Properties of Al—Mg—Sc Alloy," Materials Transactions (2005) 46(6):1148-1153.

Zakharov, V. V., "Effect of Scandium on the Structure and Properties of Aluminum Alloys," Metal Science and Heat Treatment (2003) 45(7-8):246-253.

* cited by examiner

CMOS COMPATIBLE LOW-RESISTIVITY Al—Sc METAL ETCH STOP

RELATED APPLICATIONS

This application claims priority to U.S. Provisional Application No. 63/069,406, filed on Aug. 24, 2020, and entitled CMOS COMPATIBLE LOW-RESISTIVITY Al-Sc METAL ETCH STOP, the entirety of which is incorporated herein by reference.

STATEMENT OF GOVERNMENT INTEREST

This invention was made with Government support under Contract No. DE-NA0003525 awarded by the United States Department of Energy/National Nuclear Security Administration. The Government has certain rights in the invention.

TECHNICAL FIELD

The present invention relates to a CMOS compatible Al—Sc metal etch stop having low resistivity for use in semiconductor devices and can enable operation at elevated temperatures (>500° C.

BACKGROUND

The use of metal etch stops have been extremely useful in semiconductor processing to effectively contour devices while stopping on a conducting surface. Although many etch techniques can be used depending on the material being etched, the device process designer must consider how a specific etch will affect the underlying film where the etch is targeted to end. Depending on the film stack to be etched, this can be non-trivial and require precise knowledge of etching conditions and etch rate to ensure no over etching occurs, which may damage or completely etch away the landing-film surface.

This issue has been noted in recent processing of $Al_{1-x}Sc_xN$ (AlScN) films deposited on top of conducting metal surfaces. The etch conditions used to etch AlScN are harsh on commonly used semiconductor device metals such as Al, $Al_{0.995}Cu_{0.005}$ (AlCu), Ti, W, Mo, and TiN, since these metals etch at a rate significantly faster than AlScN. Further, etching of AlScN gets exponentially more difficult as the Sc atomic percent (at. %) increases in the AlScN system compared to AlN. Etch rates, based on the etch mask removal, for AlScN 12.5% was approximately 3.5 times slower than that of AlN using identical $Cl_2$ and $BCl_3$ chemistries. See, M. D. Henry et al., "ScAlN etch mask for highly selective silicon etching," Journal of Vacuum Science & Technology B, Nanotechnology and Microelectronics: Materials, Processing, Measurement, and Phenomena, vol. 35, no. 5, art. no. 052001 (2017), the contents of which are incorporated herein by reference.

Combined with the etch variation that is normally encountered in an etch recipe, landing on a conducting metal surface during an AlScN etch without over or under etching becomes extremely difficult depending on the metallization. $SiO_2$ is often used as an etch stop in semiconductor device fabrication but is insufficient when using such an aggressive etch process, and only gives a higher margin of error when over etching is needed.

Given that AlScN has been shown to be extremely etch resistant compared to AlN, the need exists for an etch stop that is both CMOS compatible, but is also compatible with the etch process required when employing AlScN, AlN, and other process flows. In a broader sense, there are very few CMOS compatible metals that can provide for an increased tolerance when over etching during a dry etch process.

SUMMARY

One aspect of the present invention relates to an Al—Sc etch stop that is both CMOS compatible and highly conductive. The bond between Al—Sc has been shown to be a very strong covalent bond in the $Al_3Sc$ system. See, D, Chen et al., "The Effect of Alloying Elements on the Structural Stability, and Mechanical and Electronic Properties of $Al_3Sc$: A First-Principles Study," Materials, vol. 12, art. no. 1539 (2019); and G. Yingjun et al., "Atomic Bonding and Properties of Al—Mg—Sc Alloy," Materials Transactions, vol. 46, no. 6, pp. 1148-1153 (2005), the contents of each of which are incorporated herein by reference. Further, the resistivity of Al+$Al_3Sc$ can be as low as 5 µΩ·cm. See, S.-L. Lee et al., "Effects of scandium addition on electrical resistivity and formation of thermal hillocks in aluminum thin films," Thin Solid Films, vol. 519, no. 11, pp. 3578-3581 (2011), the contents of which are incorporated herein by reference.

$Al_3Sc$ has also been shown to be more corrosion resistant than pure Al when dipped in NaCl solutions, which can explain its resistance to inductively coupled plasma (ICP) chlorine-based etches used in the AlN and AlScN process. See, M. K. Cavanaugh et al., "Investigating localized corrosion susceptibility arising from Sc containing intermetallic $Al_3Sc$ in high strength Al-alloys," Scripta Materialia, vol. 56, pp. 995-998 (2007); and H.-L. Liao et al., "On the characterization of Al-0.11 wt. % Sc alloy thin film," Thin Solid Films, vol. 517, pp. 4867-4870 (2009), the contents of each of which are incorporated herein by reference.

$Al_3Sc$, in accordance with one or more embodiments of the present invention, makes an excellent low resistivity metal etch stop when used in an AlN or AlScN etch. Further, the more general composition of Al—Sc metal is enough to make an effective etch stop, i.e., low-temperature sputter deposited $Al_{0.80}Sc_{0.20}$ provides similar results to a high-temperature deposition to form an $Al_3Sc$ phase. Thus, allowing the use of lift-off resist to pattern etch stops.

In at least one embodiment of the present invention, a semiconductor device comprises a substrate, a layer of Al—Sc on the substrate, and an active layer on the layer of Al—Sc.

In various embodiments of the present invention, the substrate includes one of a semiconductor wafer, a processed semiconductor wafer, an in-process semiconductor wafer, a composite wafer, or a cavity SOI wafer; the layer of Al—Sc includes $Al_{1-x}Sc_x$ (with x between approximately 5.0 at. % and approximately 100 at. %, with x is between approximately 5 at. % and approximately 33 at. %); the layer of Al—Sc includes substantially $Al_3Sc$; a thickness of the layer of Al—Sc is between approximately 10 nm and approximately 10,000 nm; the layer of Al—Sc has a resistivity of approximately 150 µΩ-cm or less or approximately 20 µΩ-cm or less; the layer of Al—Sc has a crystallographic orientation of 111; the layer of Al—Sc includes a layer of Sc and a capping layer of Al or Al—Sc on the layer of Sc; and the layer of Al—Sc has a sloped-sidewall with an angle of approximately 10° to approximately 35° from a normal to a plane of the layer of Al—Sc.

In other embodiments of the present invention, the device further comprises an adhesion promoting layer, the adhesion promoting layer between the substrate and the layer of Al—Sc; the adhesion promoting layer includes at least one of AlN, $Al_{1-x}Sc_xN$, $Al_xGa_{1-x}N$, GaN, NbN, sapphire, Sc, SiN, Ta, TaN, Ti, TiN, or W; a thickness of the adhesion promoting layer is between approximately 10 nm and approximately 150 nm; the active layer includes $Al_{1-x}Sc_xN$ (with x between 0.0 at. % and approximately 45 at. %); the active layer includes at least one of Si, SiN, GaN, AlN, $Al_xGa_{1-x}N$, AlScN, or sapphire; the active layer includes at least one of $SiO_2$, $Si_3N_4$, AlN, or a doped or undoped silicate glass; at least a portion of the active layer has been removed down to the layer of Al—Sc; the layer of Al—Sc can resist plastic deformation induced by heating of the semiconductor device; and the semiconductor device can operate at temperatures up to at least 500° C.

Features from any of the disclosed embodiments may be used in combination with one another, without limitation. In addition, other features and advantages of the present disclosure will become apparent to those of ordinary skill in the art through consideration of the following detailed description and the accompanying drawings.

BRIEF DESCRIPTION OF THE DRAWINGS

The drawings illustrate several embodiments of the invention, wherein identical reference numerals refer to identical or similar elements or features in different views or embodiments shown in the drawings. The drawings are not to scale and are intended only to illustrate the elements of various embodiments of the present invention.

DETAILED DESCRIPTION

Device Structure

Figure 1:
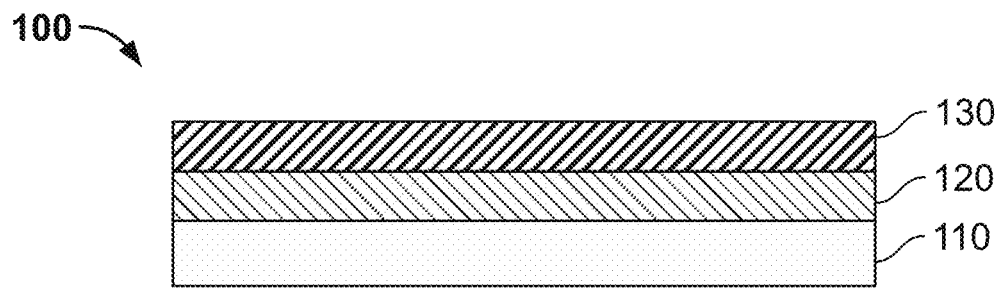
FIG. 1 illustrates a cross-section view of a device in accordance with one or more embodiments of the present invention.

FIG. 1 illustrates a cross-section view of a device 100 in accordance with one or more embodiments of the present invention. The device includes a substrate 110, upon which an Al—Sc layer 120 is deposited. An adhesion promoting layer, not illustrated, may be included between the substrate 110 and the Al—Sc layer 120 to promote adhesion of the Al—Sc layer 120 to the substrate 110. An active layer 130 is deposited on the Al—Sc layer 120.

The substrate 110 may be any suitable substrate including a semiconductor wafer, for example a silicon (Si), sapphire, gallium nitride (GaN), aluminum nitride (AlN), or silicon carbide (SiC) wafer; a processed semiconductor wafer with one or more integrated circuits and/or one or more microelectromechanical systems (MEMSs) formed thereon; an in-process semiconductor wafer with one or more integrated circuits and/or one or more microelectromechanical systems (MEMSs) being formed thereon; a composite wafer, for example a semiconductor-on-insulator (SOI) wafer or an insulator on semiconductor wafer, e.g., a surface oxidized Si wafer; or a cavity SOI wafer in which one or more cavities is formed below the semiconductor layer.

The optional adhesion promoting layer may be formed of any suitable material. An exemplary adhesion promoting layer may be formed of one or more layers of aluminum nitride (AlN), aluminum scandium nitride (AlScN), gallium nitride (GaN), aluminum gallium nitride (AlGaN), niobium nitride (NbN), sapphire, silicon nitride (SiN), titanium (Ti), scandium (Sc), tantalum (Ta), titanium nitride (TiN), tantalum nitride (TaN), and/or tungsten (W). The optional adhesion promoting layer may be deposited by any suitable process. For example, the optional adhesion promoting layer may be deposited by a sputtering process, an ionized metal plasma (IMP) process, a physical vapor deposition (PVD) process, a chemical vapor deposition (CVD) process, a metal organic chemical vapor deposition (MOCVD) process, or molecular beam epitaxy (MBE) process. The optional adhesion promoting layer preferable has a thickness of approximately 10 nm to approximately 150 nm. One additional function of the optional adhesion promoting layer is that it may serve to orient the crystal structure of the Al—Sc layer 120. See, G. Esteves et al., "CMOS compatible metal stacks for suppression of secondary grains in $Sc_{0.125}Al_{0.875}N$," Journal of Vacuum Science & Technology A, vol. 37, art. no. 021511 (2019), the contents of which are incorporated herein by reference.

The Al—Sc layer 120 may be formed of any suitable composition of Al—Sc. In a preferred embodiment, the Al—Sc layer 120 has a composition of $Al_{1-x}Sc^x$ with x having a value between approximately 5.0 and approximately 100 at. %. In a more preferred embodiment, the Al—Sc layer 120 has a composition of $Al_{1-x}Sc_x$ with x having a value between approximately 20 and approximately 33 at. %, while a most preferred embodiment has a composition of substantially $Al_3Sc$, which is 25 at. %. (Unless specified otherwise, all compositions are given as at. %.) The Al—Sc layer 120 may be deposited by any suitable process. For example, the Al—Sc layer 120 may be deposited by a sputtering process, an IMP sputtering process, or a PVD process. The Al—Sc layer 120 preferable has a thickness of approximately 10 nm to approximately 10,000 nm.

In at least one embodiment of the present invention, the active layer 130 may be formed of any suitable composition of AlN or AlScN. As AlN and AlScN are typically used for their piezoelectric attributes, the composition of $Al_{1-x}Sc_xN$ will preferably have an x value between approximately 0.0 at. %, i.e., AlN, and approximately 45 at. %. Alternatively, $Al_{1-x}Sc_xN$ can be used for its ferroelectric attributes. The active layer 130 may be deposited by any suitable process. For example, the active layer 130 may be deposited by a sputtering process, a PVD process, a CVD process, a metalorganic CVD (MOCVD) process, or a molecular beam epitaxy (MBE) process.

In at least one other embodiment of the present invention, the active layer 130 may be formed of any suitable semiconductor or dielectric material. For example, the active layer 130 may be formed of Si, SiN, GaN, AlGaN, AlN, AlScN, or sapphire. Further, the active layer 130 may be formed, for example, of $SiO_2$, $Si_3N_4$, AlN, or a doped or undoped silicate glass.

In at least one embodiment of the present invention, the Al—Sc layer 120 serves the function of an etch stop layer during fabrication of the device 100. In at least one other embodiment of the present invention, the Al—Sc layer 120 serves as a high temperature electrical lead for the device 100, which may operate at high temperatures. In yet at least one additional embodiment, the Al—Sc layer 120 serves as both an etch stop layer during fabrication of the device 100 and serves as a high temperature electrical lead in the completed device 100. In another embodiment of the present invention, the Al—Sc layer 120 serves as a mask layer for protecting or defining an underlying device or device layer formed, for example, in the substrate 110. In another embodiment of the present invention, the Al—Sc layer 120 may serve as a protection layer against corrosion from NaCl, and possibly sulfur- or chlorine-containing gases.

Etch Stop Demonstration Results

To demonstrate the efficacy of Al—Sc as an etch stop layer, Al and $Al_{0.80}Sc_{0.20}$ films were sputter deposited on Ti adhesion promoting layers on three separate wafers. The first wafer included a 20 nm Ti adhesion promoting layer with 100 nm Al layer. The second wafer included a 100 nm Ti adhesion promoting layer with a 110 nm $Al_{0.80}Sc_{0.20}$ layer, with $Al_{0.80}Sc_{0.20}$ deposited at 400° C. Depositions at temperatures in excess of 300° C. allow for the $Al_3Sc$ phase to crystallize in AlSc compositions having less than 33 at. % Sc. The third wafer included a 100 nm Ti adhesion promoting layer with a 110 nm $Al_{0.80}Sc_{0.20}$ layer, with $Al_{0.80}Sc_{0.20}$ deposited at room temperature. The $Al_{0.80}Sc_{0.20}$ layer of the third wafer does not have a crystallized $Al_3Sc$ phase due to a low platen temperature of less than 75° C. during the deposition. The three wafers were patterned lithographically in preparation for an ICP etch.

Two different etch process recipes were used: the first etch process recipe is used to etch Al, while the second etch process recipe is used to etch AlN. Details regarding these two etch process recipes are shown in Table 1.

TABLE 1

Etching Parameters for the Al and AlN Etch Process Recipes

| Parameter | Al Recipe | AlN Recipe |
|---|---|---|
| Bias | 20 W | 200 W |
| ICP | 1000 W | 1000 W |
| Pressure | 1.5 mTorr | 1.7 mTorr |
| $Cl_2$ | 30 sccm | 30 sccm |
| $BCl_3$ | 12 sccm | 12 sccm |

Figure 2A:
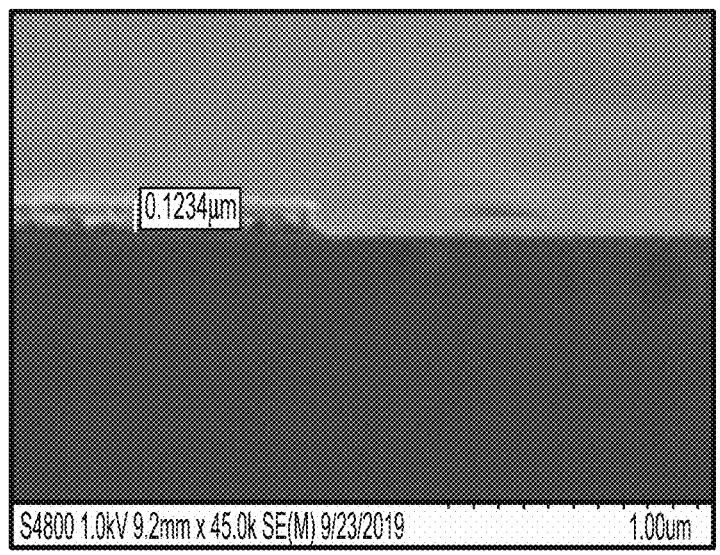
FIGS. 2A-2B are scanning electron micrograph (SEM) images illustrating the etch results achieved using a method in accordance with one or more embodiments of the present invention.
Figure 2B:
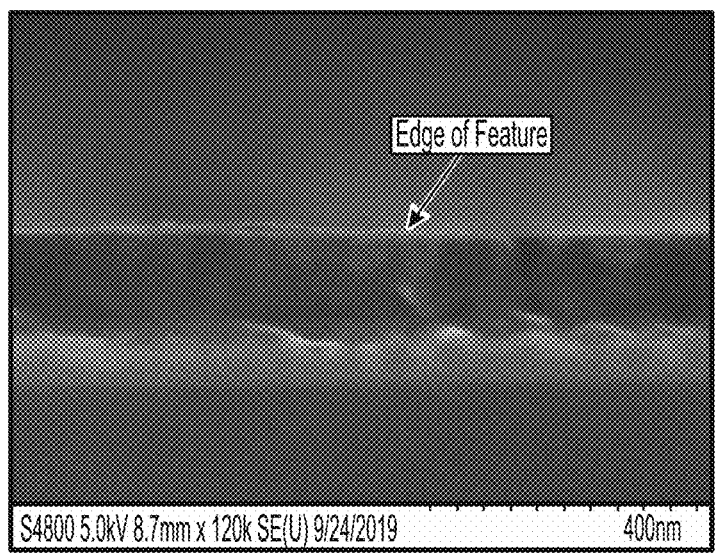
Figure 3:
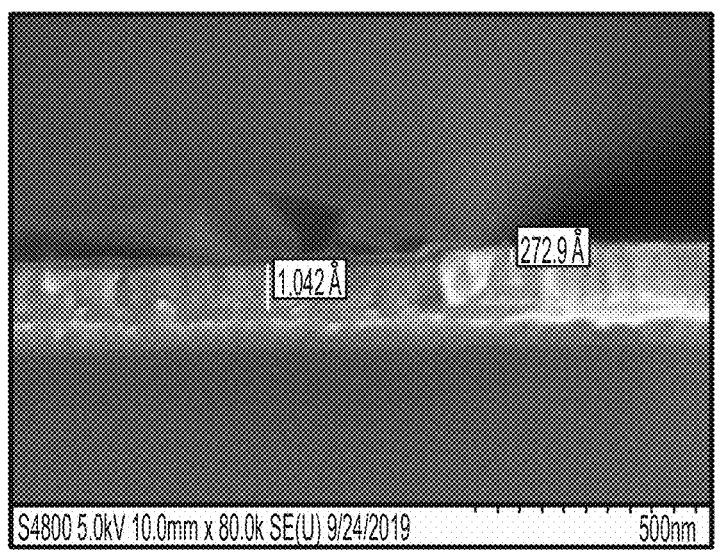
FIG. 3 is an SEM image of a cross-section of a sample in accordance with one or more embodiments of the present invention subjected to an etch process.

Portions of the first and second wafers were subjected to the Al etch process. FIGS. 2A and 2B are scanning electron micrograph (SEM) images illustrating the etch results for the first and second wafers, respectively. FIG. 2A reveals that subjecting the first wafer to just thirty seconds of the Al etch process removed both the 100 nm Al layer and the 20 nm Ti adhesion promoting layer. FIG. 2B reveals that the $Al_{0.80}Sc_{0.20}$ layer on second wafer was unaffected by the Al etch process. FIG. 3 is an SEM image of a cross-section of a sample from the second wafer after being subjected to a sixty second etch process using the AlN etch recipe. The AlN etch process removed 273 Å of the $Al_{0.80}Sc_{0.20}$ layer.

Figure 4A:
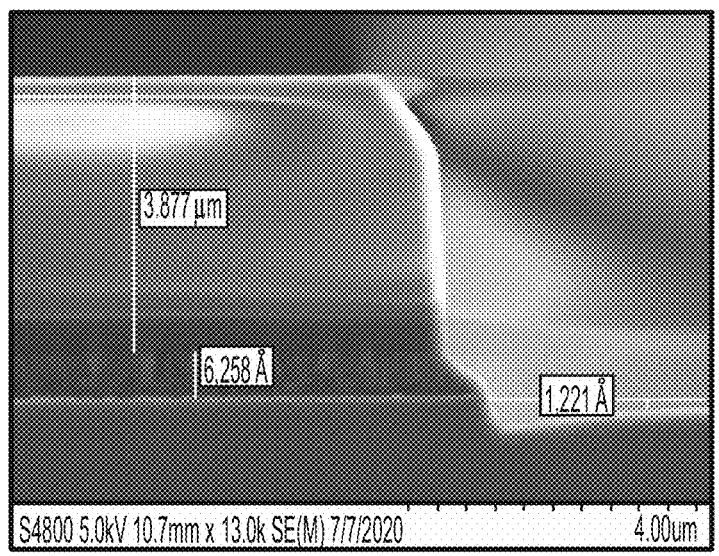
FIGS. 4A-4B are SEM images of cross-sections of samples in accordance with one or more embodiments of the present invention subjected to dry etch processes.
Figure 4B:
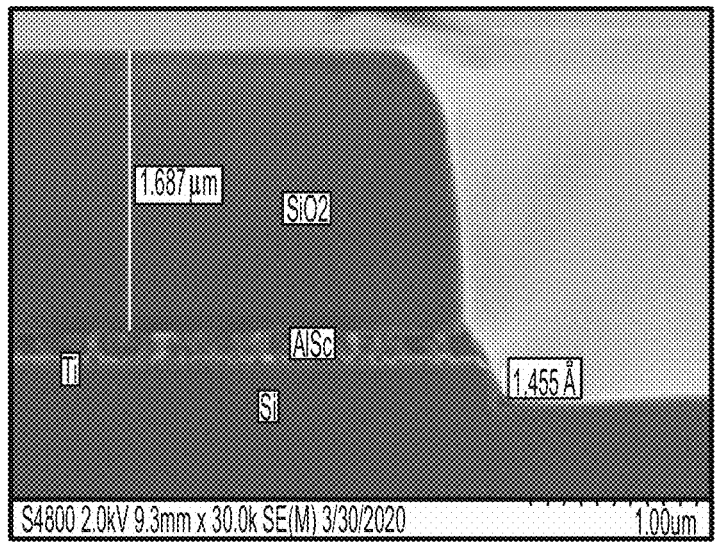

This experiment was repeated on additional samples from the second wafer, resulting in an etch rate of ~21 nm/min. Table 2 compares the etch rates of AlN, $Al_{0.8}Sc_{0.2}N$, and $Al_{0.80}Sc_{0.20}$. As shown, the $Al_{0.80}Sc_{0.20}$ etch rate can be less than half that of $Al_{0.8}Sc_{0.2}N$, and more than an order of magnitude less than that for AlN, depending upon the etch parameters. FIG. 4A is an SEM image of the result of an etch experiment using $Cl_2/BCl_3$ done on a fourth wafer, having a 626 nm thick $Al_{0.80}Sc_{0.20}$ film, at a higher bias, which showed an etch rate of 43 nm/min and 69 nm/min depending upon the chemistries used. Etch conditions for this experiment are provided in Table 3. These results align well with studies that show the $Al_3Sc$ phase that is present in the $Al_{0.80}Sc_{0.20}$ film is corrosion resistant when exposed to NaCl solutions compared to Al (see Cavanaugh and Liao), which can explain why the dry etch rate of $Al_{0.80}Sc_{0.20}$ in Cl-based etch chemistries is low, along with the poor volatility Sc has with Cl. The SEM image in FIG. 4B illustrates that etching $Al_{0.80}Sc_{0.20}$ can be challenging given the sloped-sidewalls that developed during the etch, a characteristic that is also present in AlScN, and that can be used to make intentionally tapered-features. These tapered features may be beneficial for certain applications and device types as the sloped sidewalls may have an angle of approximately 10° to approximately 35° from a normal to a plane of the $Al_{0.80}Sc_{0.20}$ layer, depending upon the etch conditions.

TABLE 2

Etch Rates for AlN, $Al_{0.8}Sc_{0.2}N$, and $Al_{0.80}Sc_{0.20}$

| Material | Etch Rate (nm/min) |
|---|---|
| AlN | ~250 |
| $Al_{0.8}Sc_{0.2}N$ | ~50 |
| $Al_{0.80}Sc_{0.20}$ | ~21 |

TABLE 3

Etching Parameters and Etch Rate for Fourth $Al_{0.80}Sc_{0.20}$ Sample

| Parameter | $Cl_2/BCl_3$ Recipe | $Cl_2/Ar$ Recipe |
|---|---|---|
| Bias | 300 W | 400 W |
| ICP | 1000 W | 1000 W |
| Pressure | 1 mTorr | 1.7 mTorr |
| $Cl_2$ | 20 sccm | 20 sccm |
| $BCl_3/Ar$ | 8 sccm | 13 sccm |
| Etch Rate | 43 nm/min | 69 nm/min |

Portions of the second and third wafers were each subjected to the AlN etch process to determine whether formation of the $Al_3Sc$ would play a role in the etch rate. The results showed that the partially crystallized $Al_3Sc$ film, which was a sputter deposited $Al_{0.80}Sc_{0.20}$ film at less than 75° C. (third wafer), was just as etch resistant as the $Al_3Sc$ deposited at 400° C. (second wafer). This appears to show that the Al—Sc bond is strong in both its crystallized and partially crystallized $Al_3Sc$ phase. This suggests that a large portion of the Al—Sc system can yield similar dry etch resistant characteristics that may be more related to the amount of Sc in the $Al_{1-x}Sc_x$ film.

Figure 5A:
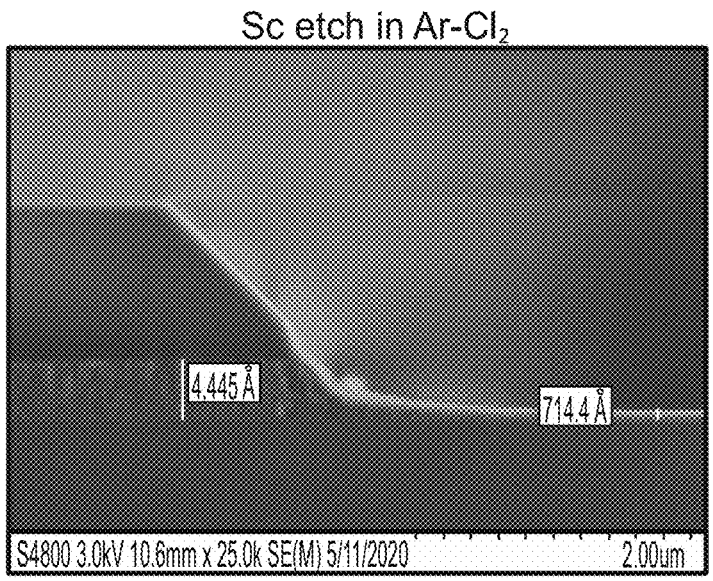
FIGS. 5A-5C are SEM images of cross-sections of samples in accordance with one or more embodiments of the present invention subjected to dry etch processes.
Figure 5B:
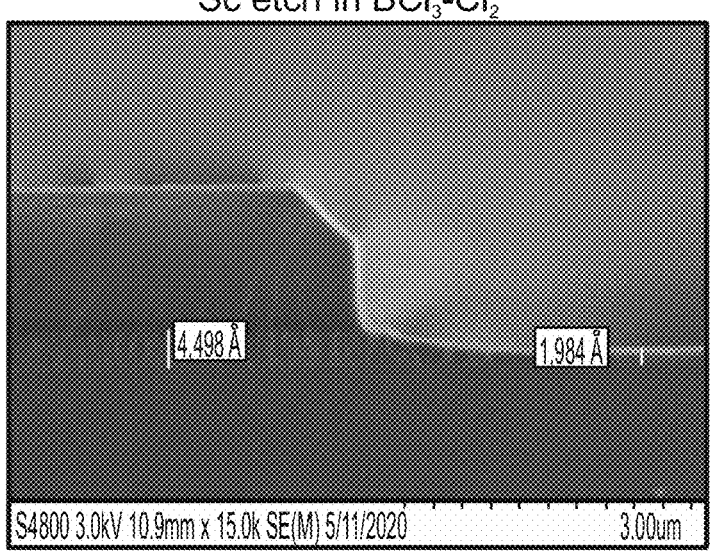
Figure 5C:
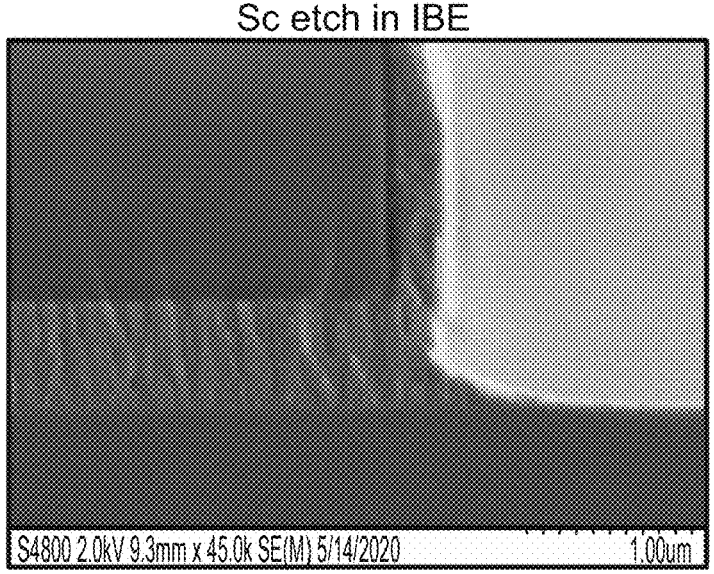
Figure 6A:
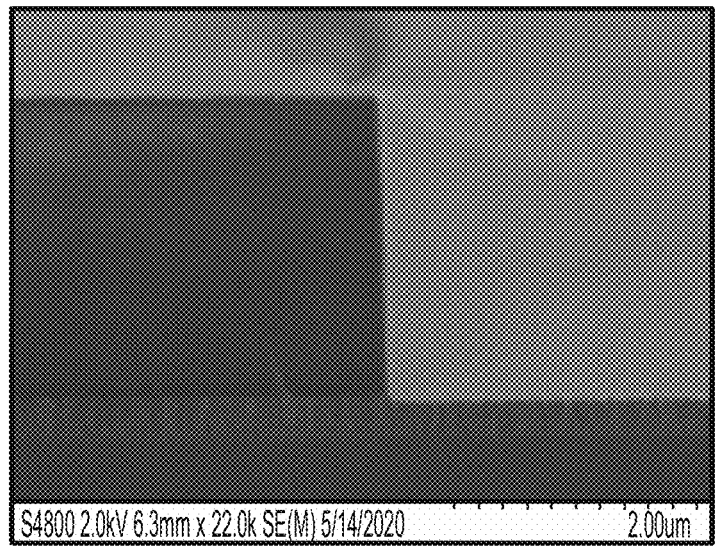
FIGS. 6A-6B are SEM images of cross-sections of samples in accordance with one or more embodiments of the present invention subjected to wet etch processes.
Figure 6B:
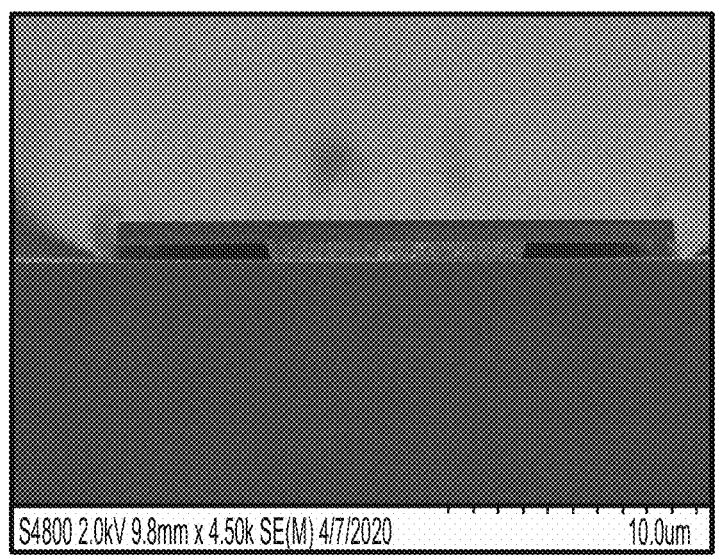

Etch results of Sc-metal can yield some insight into the etch characteristics of Al—Sc, as Sc metal is also shown to be extremely difficult to etch with both ICP etching and wet etching. Chlorine and $BCl_3$ are often used as the main reactant in ICP etching to react with Al to etch AlN. FIGS. 5A-5C are SEM cross-sectional images of Sc-metal after being etched for 15 minutes in Ar—$Cl_2$, $BCl_3$—$Cl_2$, and Ar ion beam etch, respectively. Approximate etch rates for each respective SEM image in FIGS. 5A-5C are 25 nm/min, 17 nm/min, and 30 nm/min. From the results illustrated in FIGS. 5A-5C, it is faster to etch Sc with ion bombardment than to rely on reacting with $Cl_2$ and $BCl_3$ due to the low volatility of Sc. The results illustrated in the SEM image of FIG. 6A demonstrate that Sc films are also resistant to a 6M KOH wet etch at room temperature and at 70° C. (results not illustrated), producing slow etch rates of less than the measurement noise and ~104 nm/min at room temperature and 70° C., respectively. These results contrast with the wet etch rate of an $Al_{0.80}Sc_{0.20}$ film, illustrated in the SEM image of FIG. 6B, which has a rapid etch rate that could not be determined due to severe undercutting of the mask. It is proposed that the KOH is attacking the Al within the matrix of the film given that Al is known to react readily with KOH and that KOH may be an alternative route to etching $Al_{0.80}Sc_{0.20}$ films in contrast to dry etching.

Figure 7:
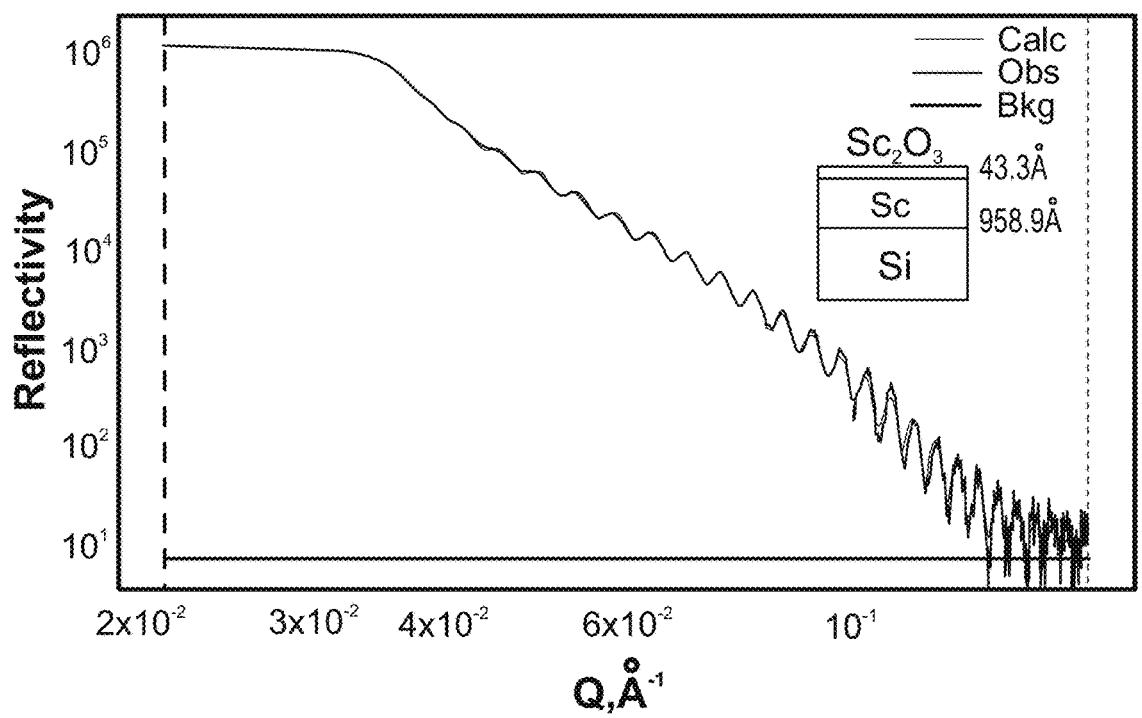
FIG. 7 is an X-ray reflectivity (XRR) scan of a Sc-metal film in accordance with one or more embodiments of the present invention.

The Sc films used in these studies all showed native oxide formations after deposition given their measured resistivity of ~144 µΩ-cm was ~2.5-3× higher than reported in Colvin and Arajs and Spedding et al. and the X-ray reflectivity (XRR) results. See, R. V. Colvin and S. Arajs, "Electrical Resistivity of Scandium," Journal of Applied Physics, vol. 34, no. 2, pp. 286-290 (1963); and F. H. Spedding et al., "The Resistivity of Scandium Single Crystals," Journal of the Less-Common Metals, vol. 23, pp. 263-270 (1971), the contents of each of which are incorporated herein by reference. The XRR measurement of a Sc film, illustrated in FIG. 7, indicates that a $Sc_2O_3$ layer was present after deposition. The calculated data best represented the observed data only when $Sc_2O_3$ was incorporated into the model. These results demonstrate that the Al—Sc system can be compositionally tuned to achieve a desired etch resistant performance but comes at the expense of an increase in resistivity given that Sc is readily oxidized. One way to combat this Sc oxidation is to form the Sc layer with a capping Al or Al—Sc layer that is more resistant to oxidation.

High-Temperature Electrical Leads

Metals play a fundamental role as electrical leads in integrated circuit (IC) technologies. Metals with low resistivity, CMOS compatibility, reliability, and chemical stability are often sought. Some of these metals today include: Al, $Al_{0.995}Cu_{0.005}$, W, Cu, Ti, TiN, Ta, TaN, Mo, etc. Metal layers are selected based on their electrical properties for an intended application and the continuous push to make high-temperature (HT) electronics is one of many IC applications that are of great interest. These applications require metals with low resistivity and chemical stability. As a result, HT electronics research has looked to refractory metals such as: Nb, Mo, W, Re, and Ta. However, choosing metals with high melting points does not mean they are chemically stable and have the desired resistivity. Therefore, the development of new metal alloys is necessary to identify and create the next generation of metals that can enable enhanced HT electronic applications. Because a large portion of the Al—Sc system may yield similar etch resistant characteristics, certain phases, for example, AlSc, $Al_2Sc$, and $AlSc_2$, can open an avenue into having a high temperature capable, i.e., melting temperature >1150° C., conducting metal etch stop that can serve as electrical leads for fabricated devices.

The Al—Sc system of various embodiments of the present invention provides a CMOS-compatible metal that can have low resistivity (≤30 µΩ-cm) after being deposited at temperatures >400° C. and can achieve further reduction in resistivity after being annealed. Certain embodiments of the present invention resulted in as-deposited resistivity values near 18 µΩ-cm, with subsequent anneals leading to improvements down to 10 µΩ-cm. The ability for this metal to withstand anneals at 600° C. while improving its resistivity suggests that it can operate at temperatures up to at least 600° C.

Figure 8A:
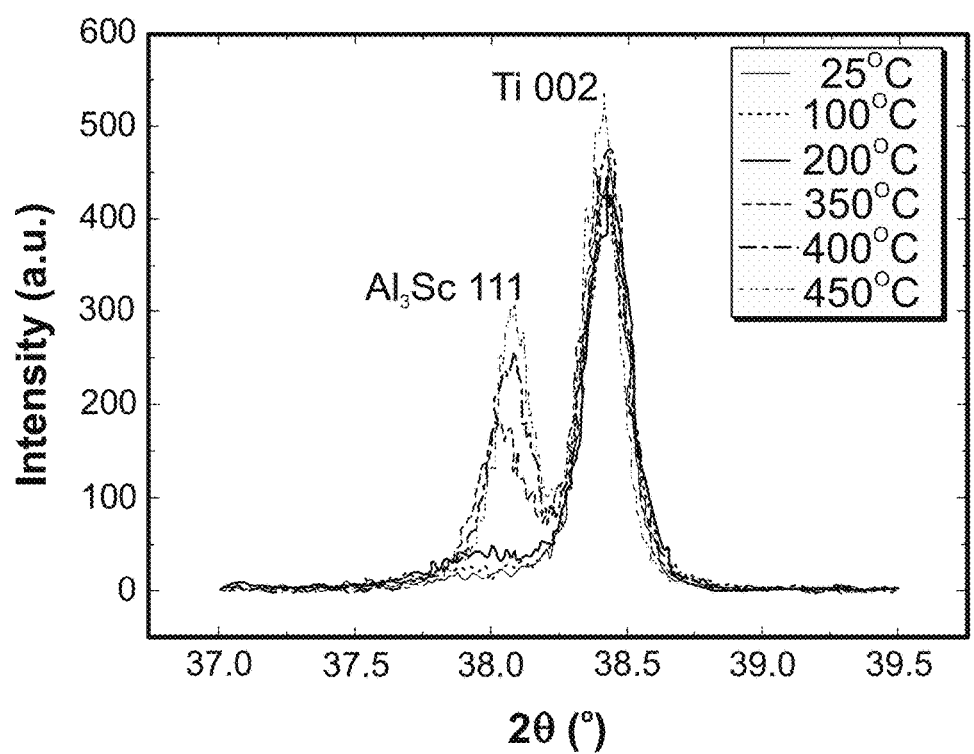
FIGS. 8A-8B illustrate the measured X-ray diffraction (XRD) curves and XRD peak intensities for structures in accordance with one or more embodiments of the present invention.
Figure 8B:
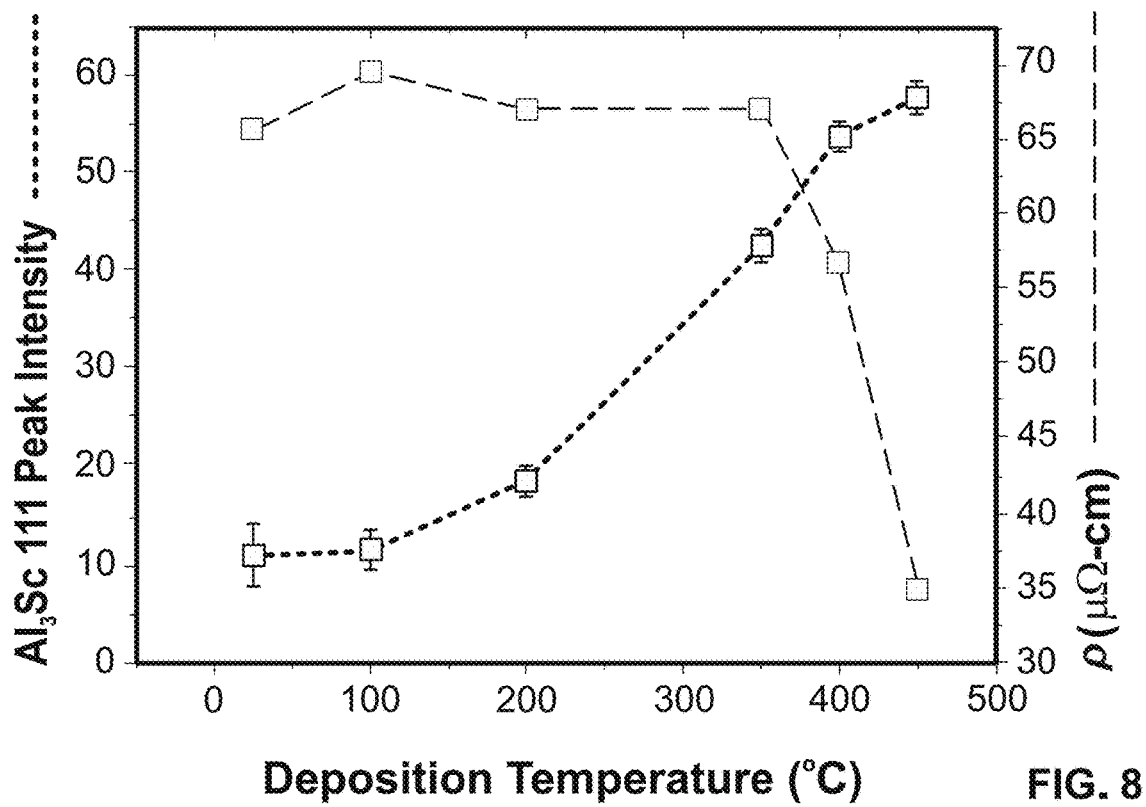

$Al_{0.80}Sc_{0.20}$ films in accordance with one or more embodiments of the present invention were sputter deposited on Si, Ti, $SiO_2$, AlN, and $Al_{0.8}Sc_{0.2}N$ layers for sheet resistance measurements and X-ray diffraction (XRD). The phase diagram of the Al—Sc system shows that at the composition of $Al_{0.80}Sc_{0.20}$, which is the target composition used to make these films, a mixture of $Al+Al_3Sc$ is present. X-ray diffraction (XRD) was used to determine that the $Al_3Sc$ phase was present in stacks consisting of Ti/$Al_3Sc$ since the Ti allows for proper templating of the $Al_3Sc$ phase, as illustrated in FIG. 8A. No Al peaks were seen in the XRD patterns, due to the lack of crystallographic orientation. However, it was seen from these stacks that higher deposition temperatures lead to a higher intensity in the $Al_3Sc$ 111 peak, as illustrated in FIG. 8B. Additionally, resistivity measurements of the Ti/$Al_{0.80}Sc_{0.20}$ stack decrease for $Al_{0.80}Sc_{0.20}$ deposited at higher temperatures, thereby demonstrating that the formation of the $Al_3Sc$ phase is favored at higher deposition temperatures. $Al_{0.80}Sc_{0.20}$ films deposited on Si, AlN, and $Al_{0.8}Sc_{0.2}N$ layers showed no diffraction reflections from the $Al_3Sc$ or Al, which suggests a lack of crystallographic texture in the $Al_3Sc$ films grown on these alternative layers, which may be due to the formation of native oxide layers prior to growth of the $Al_{0.80}Sc_{0.20}$ films. The results for the Ti/$Al_{0.80}Sc_{0.20}$ stack suggests the high crystallographic 111 texture of the $Al_3Sc$ phase formed within the $Al_{0.80}Sc_{0.20}$ film is due to not introducing a vacuum break between the deposition of the Ti and $Al_{0.80}Sc_{0.20}$ films.

Figure 9A:
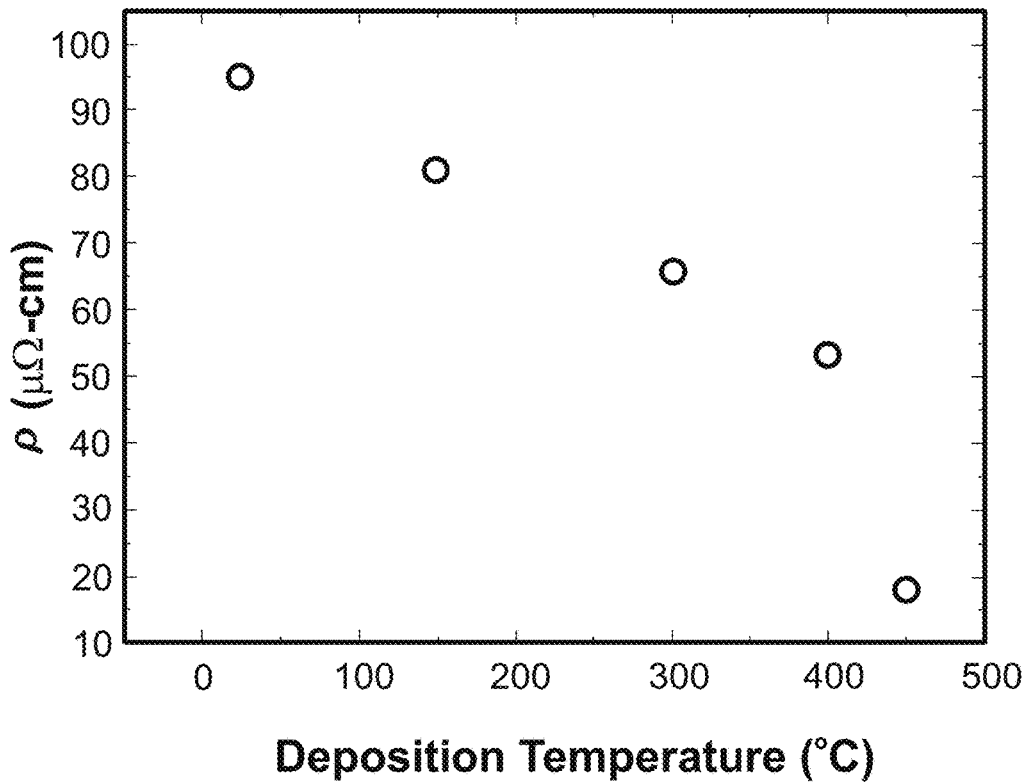
FIGS. 9A-9B illustrate the measured resistivities as a function of deposition temperature and anneal time for structures in accordance with one or more embodiments of the present invention.
Figure 9B:
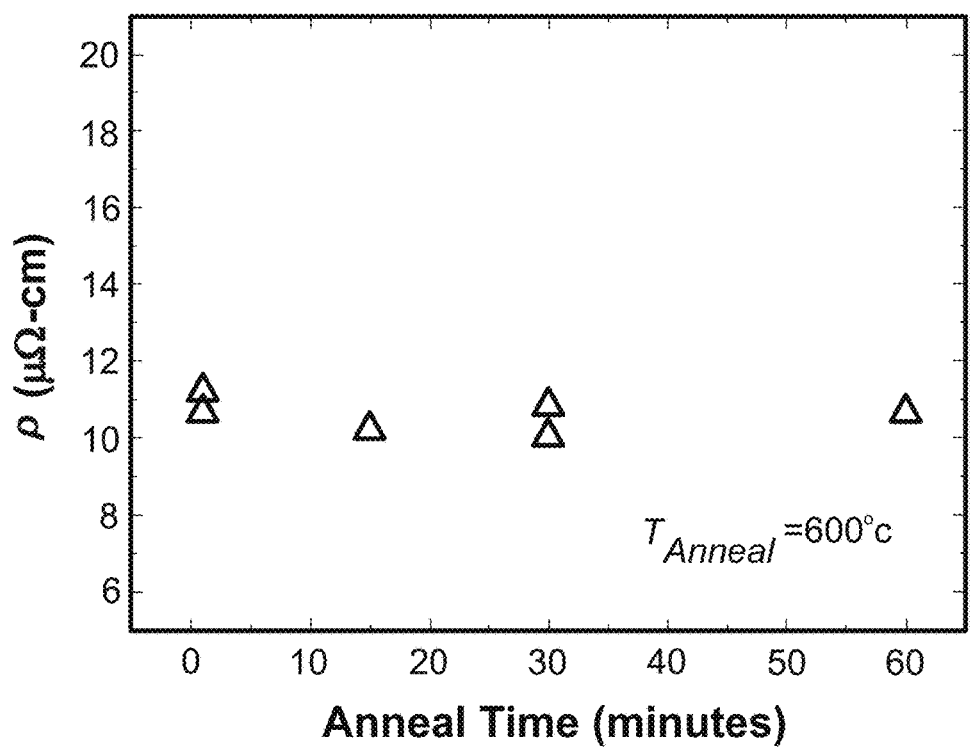

Measured resistivity using a four-point probe for $Al_{0.80}Sc_{0.20}$ films deposited on a $SiO_2$ layer at different temperatures are illustrated in FIG. 9A. Improvements in resistivity are seen when the deposition temperature is increased, which promotes the formation of the Al$_3$Sc phase as illustrated in FIG. 9A. It should be noted that while resistivity is driven primarily by the deposition temperature, crystallographic texture is driven by both deposition temperature and the underlying material, for example, the substrate or any intervening layers. Subsequent annealing at higher temperatures also showed that the resistivity can be improved. FIG. 9B illustrates the measured resistivity of Al$_{0.80}$Sc$_{0.20}$ films after annealing at 600° C. while flowing Ar gas under vacuum for various anneal times. All films in FIG. 9B were deposited initially at 450° C. and showed resistivity values of ~17 µΩ-cm, which decreased to ~11 µΩ-cm after annealing. Depositing at a lower temperature and annealing to reduce the resistivity is also possible and has been shown for films deposited at a temperature of 400° C. and 25° C. on SiO$_2$. Additionally, Al$_{0.80}$Sc$_{0.20}$ films deposited on AlN and Al$_{0.8}$Sc$_{0.2}$N layers that underwent an initial 30 minute anneal in Ar at 600° C. followed by a second anneal in air at 600° C. for 30 minutes showed very little change in resistivity. These results are summarized in Table 4 and suggest that Al$_3$Sc in accordance with one or more embodiments of the present invention can operate at elevated temperatures as an electrode material for piezoelectric resonators and other electronic applications. Additional experiments at an annealing temperature of 650° C. produced results like those illustrated in FIG. 9B.

TABLE 4

Resistivity of Al$_{0.80}$Sc$_{0.20}$ after Annealing at 600° C. for 30 Minutes

| | Resistivity (µΩ-cm) | | |
|---|---|---|---|
| Underlayer | As-Dep. | After Ar Anneal | After Air Anneal |
| AlN | 18.07 | 10.09 | 10.91 |
| Al$_{0.8}$Sc$_{0.2}$N | 18.96 | 10.85 | 11.7 |

Figure 10A:
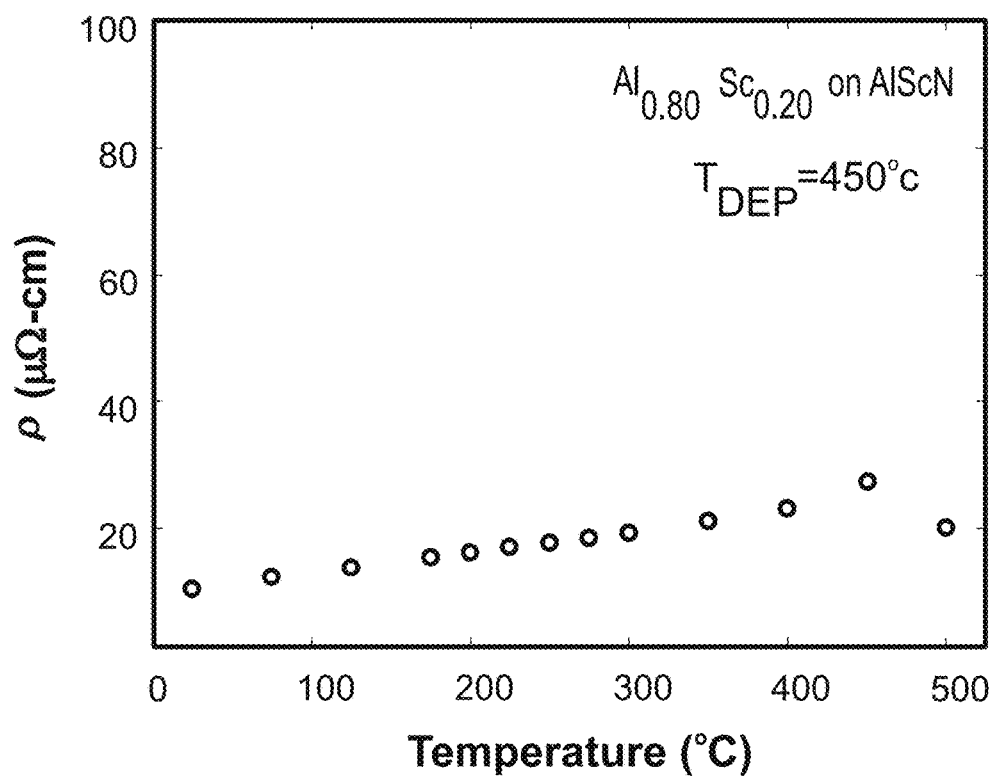
FIGS. 10A-10C illustrate the measured resistivities as a function of temperature for structures in accordance with one or more embodiments of the present invention.
Figure 10B:
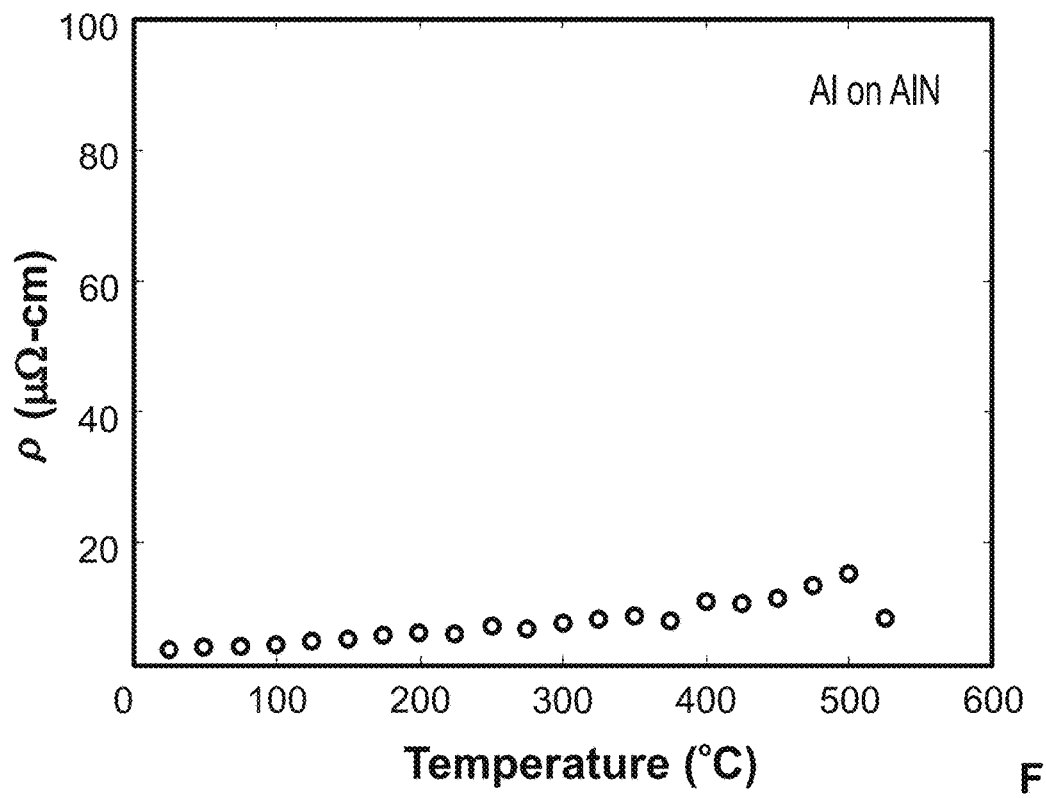
Figure 10C:
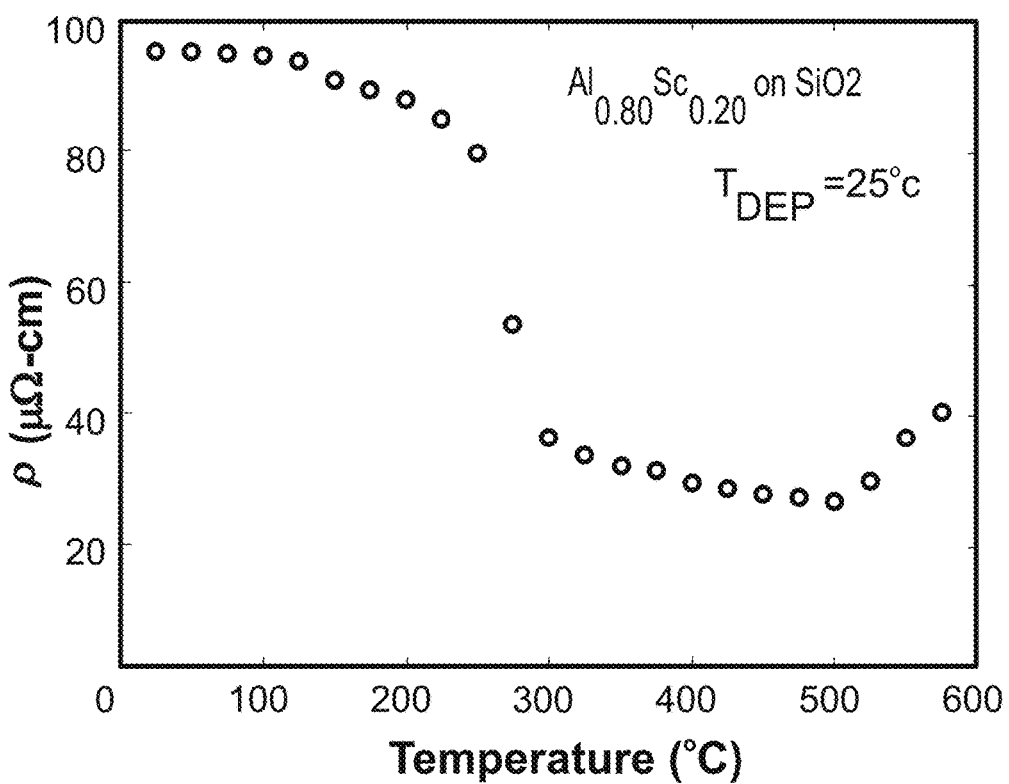
Figure 11A:
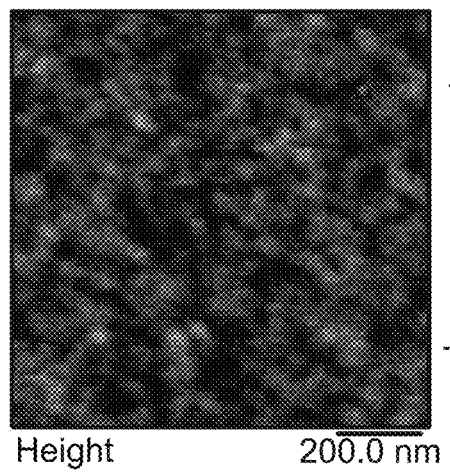
FIGS. 11A-11D are atomic force microscope (AFM) images of samples in accordance with one or more embodiments of the present invention.
Figure 11B:
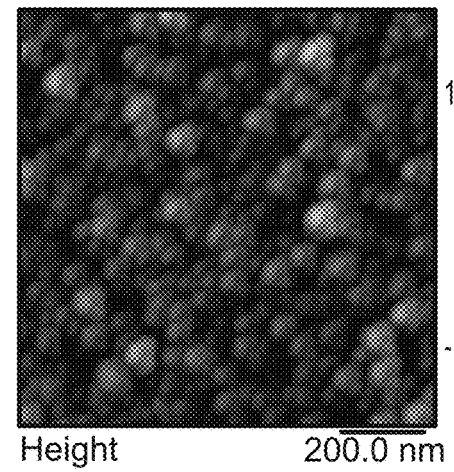
Figure 11C:
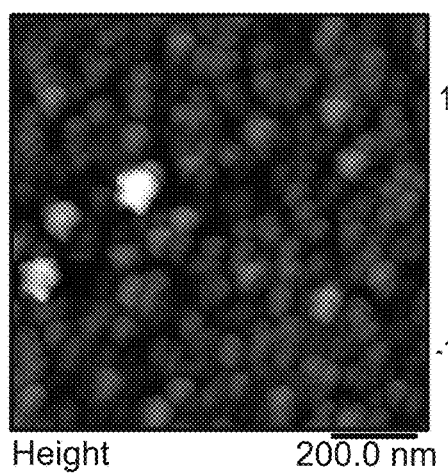
Figure 11D:
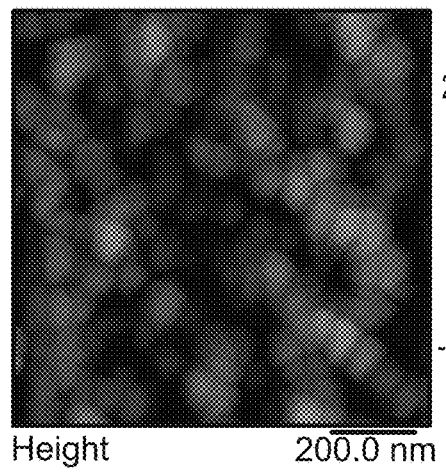

To further explore the electrical behavior of Al$_{0.80}$Sc$_{0.20}$ films, 100-nm films deposited at 25° C. and 450° C. where exposed to air and their resistivity measured as a function of temperature and compared to an equivalent Al film. FIGS. 10A-10C illustrate the resistivity versus temperature profiles of an 100-nm Al$_{0.80}$Sc$_{0.20}$ film deposited at 450° C. on top of Al$_{0.8}$Sc$_{0.2}$N then annealed at 600° C. in Ar for 30 minutes; a 100-nm Al on top of AlN; and 100-nm Al$_{0.80}$Sc$_{0.20}$ deposited at 25° C. on top of SiO$_2$, respectively. At each temperature, a minimum of 5 measurements were taken, with all samples tested in open air on a hot chuck. Resistivity was determined using the van der Pauw method, with results at room temperature compared to corresponding four-point probe measurements. Comparing FIGS. 10A and 10B, both Al and Al$_{0.80}$Sc$_{0.20}$ show a linear resistivity vs. temperature profile. The kink shown on the final point of each plot is due to voltage compliance issues with the test equipment, which may be due to contact resistance during heating, irregular sample size, probes moving during heating, and probe size used.

In terms of chemical stability, after high temperature testing, the Al film was roughened and hazy and showed a slight increase in resistivity. However, the advantage of using Al$_3$Sc as opposed to Al for high operating temperature applications is that Al$_3$Sc has a reduce thermal expansion coefficient compared to Al. Values have been reported between 13-16×10$^{-6}$ K$^{-1}$ from two studies. See, M. Asta and V. Ozoliņš, "Structural, vibrational, and thermodynamic properties of Al—Sc alloys and intermetallic compounds," Physical Review B, vol. 64, art. no. 094104 (2001); and Y. Harada and D. C. Dunand, "Thermal expansion of Al$_3$Sc and Al$_3$(Sc$_{0.75}$X$_{0.25}$)," Scripta Materialia, vol. 48, pp. 219-222 (2003), the contents of each of which are incorporated herein by reference.

Further, Al$_3$Sc is a stronger metal as compared to Al and has been shown to decrease hillock formation in Al. This should enable AlSc alloys to handle thermal deformation much easier than Al. See, J. Røyset and N. Ryum, "Scandium in aluminum alloys," International Materials Reviews, vol. 50, no. 1, pp. 19-44 (2005); and V. V. Zakharov, "Effect of Scandium on the Structure and Properties of Aluminum Alloys," Material Science and Heat Treatment, vol. 45, pp. 246-253 (2003), the contents of each of which are incorporated herein by reference. Given the strengthening provided by the addition of Sc and the corresponding lowering of the coefficient of thermal expansion (CTE), Al$_3$Sc can be used with other layers that have dissimilar CTEs and be resistant to plastic deformation.

After high-temperature testing, the Al$_{0.80}$Sc$_{0.20}$ layer on top of the Al$_{0.8}$Sc$_{0.2}$N layer is slightly hazy and has an increase of ~3 µΩ-cm, while the Al$_3$Sc layer on top of the SiO$_2$ layer kept its highly reflective surface but shows a slight yellow discoloration. The haziness of the Al$_{0.80}$Sc$_{0.20}$ on top of the Al$_{0.8}$Sc$_{0.2}$N could be due to the increased roughness of the Al$_{0.8}$Sc$_{0.2}$N, which typically has abnormal grain (AG) growth on its surface and these AGs can act as sites for defects to occur during growth or heating. See, G. Esteves et al. This can be improved by depositing the film on AlN or AG-free AlScN. Although discoloration is typically a sign of oxidation at the surface, the resulting room temperature resistivity is 15.35 µΩ-cm, which is an approximately 5 µΩ-cm increase over the originally expected starting value of approximately 10 µΩ-cm if the sample had been annealed prior to testing.

FIG. 10C illustrates the unique resistivity versus temperature behavior of Al$_{0.80}$Sc$_{0.20}$ deposited on SiO$_2$ at 25° C. The resistivity decrease near 285° C. suggests a precipitation of the Al$_3$Sc phase. FIGS. 11A-11D illustrate atomic force microscope (AFM) images of the microstructure of Al—Sc films deposited at various deposition temperatures on top of SiO$_2$. Although from the AFM images it isn't clear if the Al$_3$Sc phase grows at the expense of another phase, it is evident that at higher deposition temperatures the grain size does increase.

In FIG. 10C, after the sharp resistivity drop, the resistivity of the Al$_3$Sc on SiO$_2$ sample continues to decrease with increasing temperature, a phenomenon that goes against what is expected of a metal. This behavior could be a result of further precipitation of Al$_3$Sc and recrystallization that eventually saturates at 500° C. FIG. 8B illustrates the evolution of the Al$_3$Sc 111 peak with increasing deposition temperature, which suggests additional Al$_3$Sc phase formation. However, an increase in crystallographic texture is associated with increasing deposition temperature due to higher adatom mobility in many other metals, therefore, this alone cannot be the justification for the Al$_3$Sc phase growing with increasing temperature. The decrease in resistivity with increasing deposition temperature could explain the formation of an Al$_3$Sc phase formation along with further recrystallization since crystallographic texture and resistivity in metals does not always correlate.

After 500° C., the Al$_{0.80}$Sc$_{0.20}$ on SiO$_2$ sample starts behaving like a typical metal and begins showing increased resistivity with increasing temperature. The 500° C. point marks an interesting observation given that Al$_3$Sc films deposited at 450° C. or below need to be annealed at higher temperatures to show further decreases in their resistivity, as illustrated in FIG. 9B. The behavior from FIG. 10C can be leveraged to create a temperature sensor that is based on the crystallization kinetics of the Al$_3$Sc phase.

Preferred Embodiment x=0.25 of Al$_{1-x}$SC$_x$

Stoichiometric Al$_3$Sc requires Al—Sc compositions near 25 at. % Sc. Given that all evidence provided this far is from films with a composition of 20 at. % Sc due to film growth source material limitations, compositional tuning to the correct Sc at. % may improve performance if Al$_3$Sc is the desired film composition. To highlight the preferred embodiment of Sc 25 at. %, a single-alloyed target of Al$_{0.75}$Sc$_{0.25}$ was obtained to make near phase pure Al$_3$Sc films. A series of 100 nm Al$_{0.75}$Sc$_{0.25}$ films were sputter deposited using a 3" Al$_{0.75}$Sc$_{0.25}$ target on 6" Si wafers that had either a 500 nm SiO$_2$ layer or a ~730 nm AlN layer that was reactively sputtered. Al$_{0.75}$Sc$_{0.25}$ films deposited on top of AlN films should mimic a top electrode on an AlN or AlScN piezoelectric device such as what might be found, for example, in a radio frequency (RF) filter, a resonator, a transducer, a piezoelectric micromachine ultrasonic transducer, or a ferroelectric capacitor. The resulting Al$_{0.75}$Sc$_{0.25}$ films underwent characterization to determine high temperature anneal resistance, resistivity vs. temperature, and corrosion resistance in a NaCl solution.

Figure 12A:
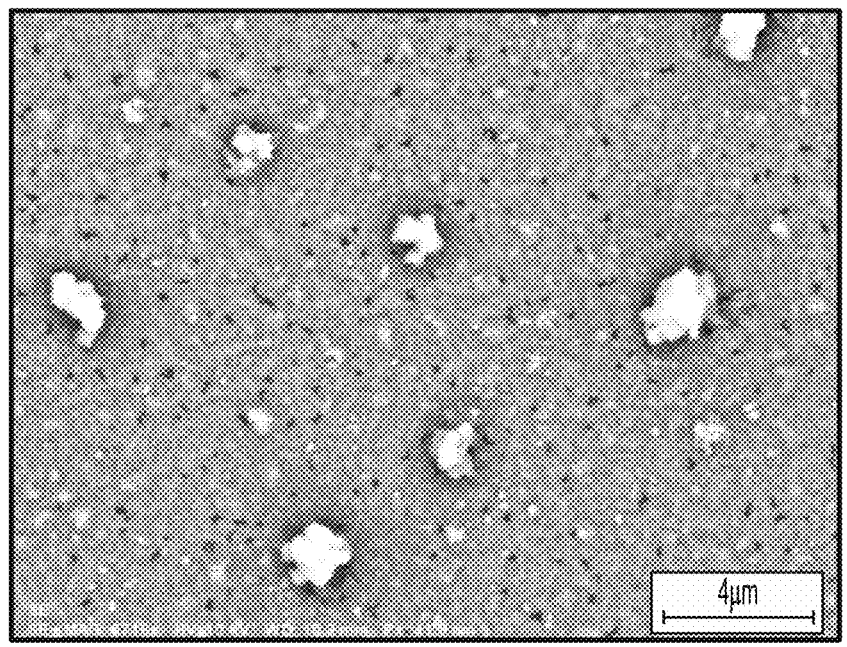
FIGS. 12A-B are SEM images of $Al_{0.80}Sc_{0.20}$ and $Al_{0.75}Sc_{0.25}$ films in accordance with one or more embodiments of the present invention after being subject to an anneal at 750° C. in an Ar environment.
Figure 12B:
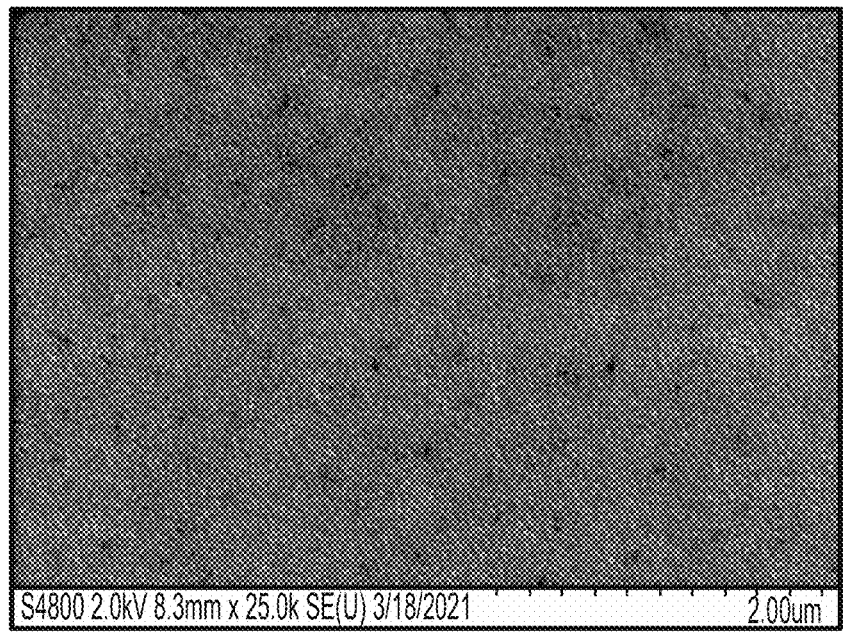

The composition used in AlSc films is critical for its use as a high temperature lead, which is demonstrated by conducting high temperature anneals of Al$_{0.80}$Sc$_{0.20}$ and Al$_{0.75}$Sc$_{0.25}$ films above the melting point of Al (660° C.). On the Al—Sc phase diagram, the Al$_{0.80}$Sc$_{0.20}$ composition is anticipated to be 20% Al and 80% Al$_3$Sc, thus heating past 660° C. should induce failure. An Al$_{0.75}$Sc$_{0.25}$ film was deposited at 25° C. on top of AlN then cleaved into pieces. The measured resistivity of the as-deposited film was ~123 µΩ-cm, an increase over Al$_{0.80}$Sc$_{0.20}$ films due to the addition of more Sc. The first anneal conducted was at 700° C. in an Ar vacuum for 5 minutes, which decreased the resistivity to 19.4 µΩ-cm. The Al$_{0.75}$Sc$_{0.25}$ film appeared to be pristine after the anneal. Afterwards, the same Al$_{0.75}$Sc$_{0.25}$ sample was subject to a 750° C. in an Ar vacuum for 2.77 hours, resulting in a resistivity of 13.9 µΩ-cm. This further decrease in resistivity suggests that either the Al$_3$Sc phase is still not fully formed despite a high temperature deposition and subsequent anneal or recrystallization continues to occur, which means improvements may be made based on how the Al$_{0.75}$Sc$_{0.25}$ film is deposited and/or annealed. FIGS. 12A and 12B are SEM images of the microstructure of Al$_{0.80}$Sc$_{0.20}$ and Al$_{0.75}$Sc$_{0.25}$ films after being subjected to a 750° C. anneal in a flowing Ar environment for 2 hours in a tube furnace and an Ar vacuum for 2.77 hours in a rapid thermal annealer (RTA), respectively. The large microstructural defects present in FIG. 12A are regions where oxygen has concentrated, according to elemental mapping (not shown), and contributes to the Al$_{0.80}$Sc$_{0.20}$ film's degradation in electrical conductivity. Smaller void-like defects are also present which could be due to the Al$_{0.80}$Sc$_{0.20}$ film alleviating thermal stress. After the 2 hour anneal in flowing Ar, the Al$_{0.80}$Sc$_{0.20}$ was no longer conductive, and strong discoloration was present. In contrast, the stoichiometric Al$_{0.75}$Sc$_{0.25}$ film that was annealed for 2.77 hours in an Ar vacuum showed a much cleaner microstructure, see FIG. 12B, with only minor defects and discoloration. The Al$_{0.75}$Sc$_{0.25}$ film still shows its metallic color as well as being highly reflective. Although the difference between the anneal type on the Al$_{0.80}$Sc$_{0.20}$ film compared to that for the Al$_{0.75}$Sc$_{0.25}$ may potentially introduce air as opposed to the RTA annealing, this experiment illustrates that Al$_{0.75}$Sc$_{0.25}$ can operate at 750° C. and how AlSc films near these compositions can fail and begin to become insulative.

Figure 13:
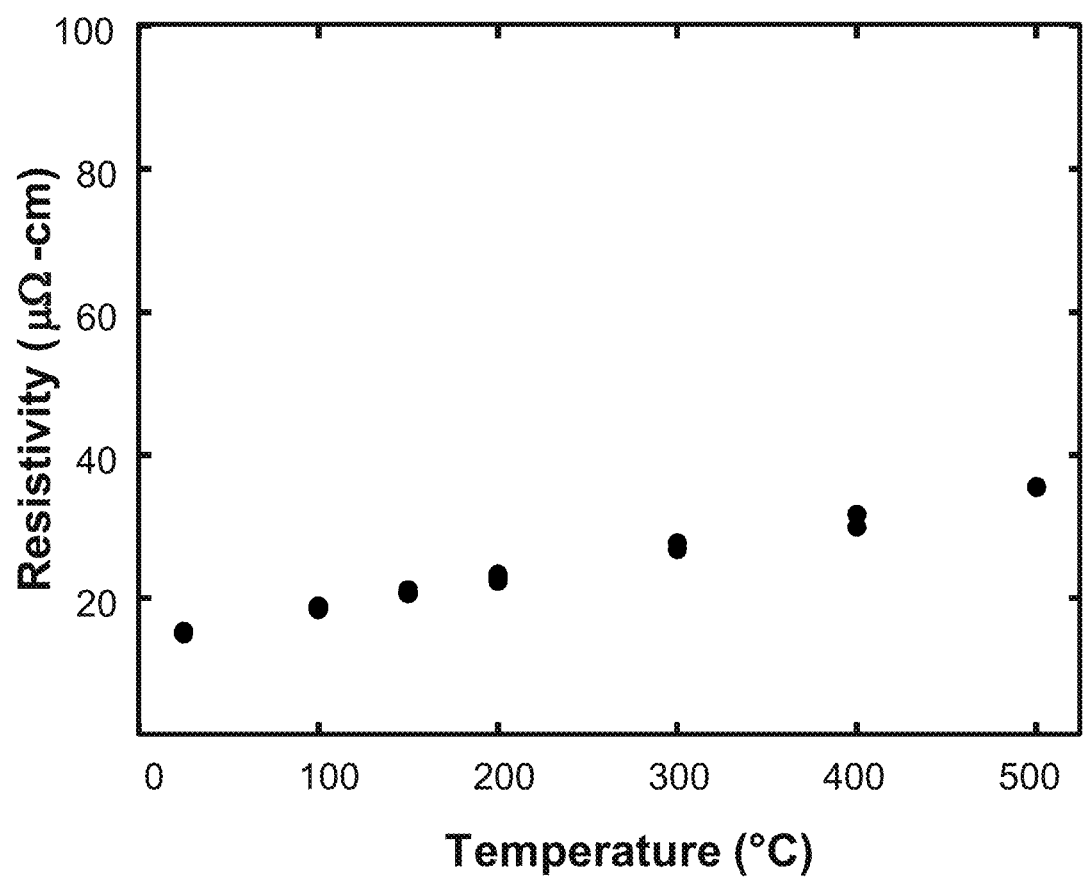
FIG. 13 illustrates the measured resistivities as a function of temperature for structures in accordance with one or more embodiments of the present invention.

Testing the resistivity as a function of temperature for an Al$_{0.75}$Sc$_{0.25}$ film deposited at 300° C. on AlN and then annealed at 600° C. in Ar for 30 minutes in an RTA showed a very linear response as illustrated in FIG. 13. This experiment, as well as those illustrated in FIGS. 10A-10C, were all carried out in air to highlight the stability of the metal film. Extrapolating FIG. 13 to what the film's resistivity would be at for 750° C., which is the temperature of the 2.77 hour anneal discussed above, results in a resistivity of approximately 47 µΩ-cm.

Figure 14A:
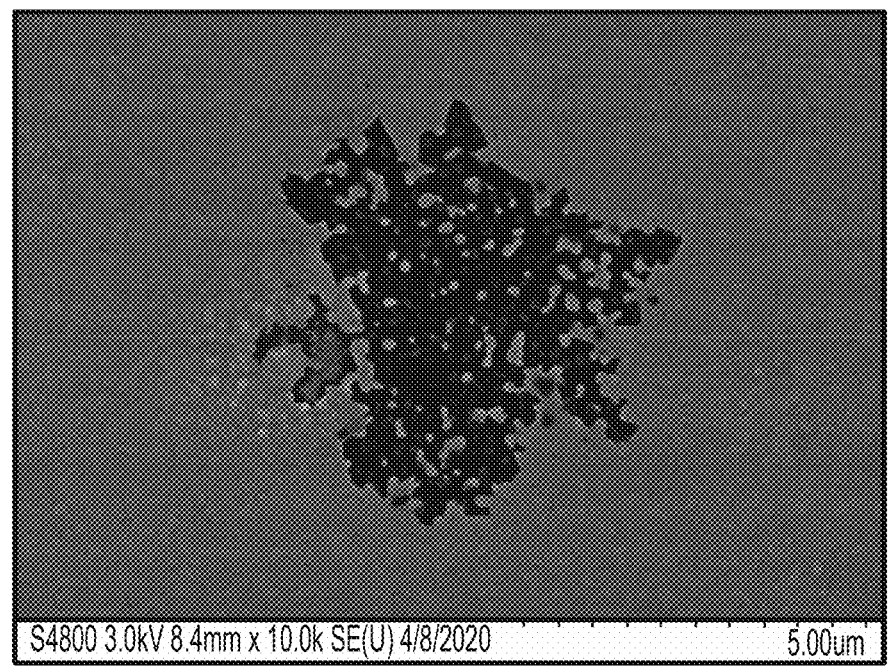
FIGS. 14A-C are SEM images of the top view of Al, AlCu, and $Al_{0.75}Sc_{0.25}$ samples in accordance with one or more embodiments of the present invention after an anneal at 600° C. in Ar vacuum for 30 minutes.
Figure 14B:
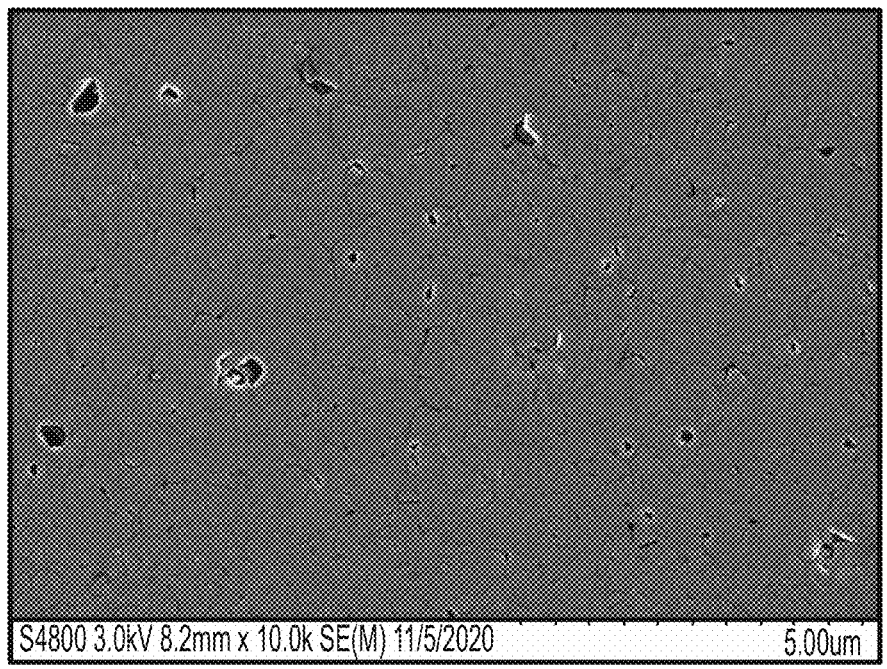
Figure 14C:
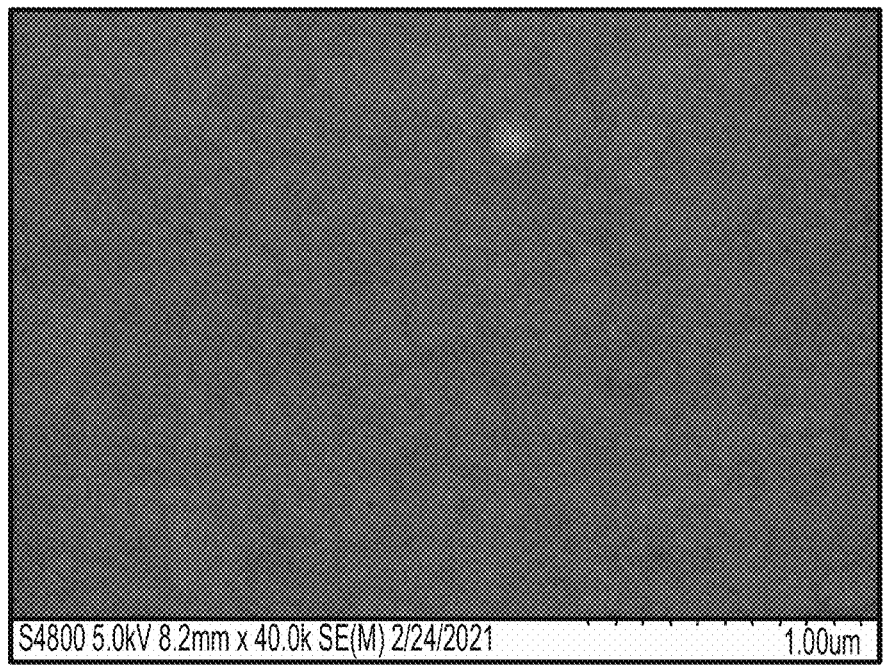

Comparing both the Al$_{0.8}$Sc$_{0.20}$ and the Al$_{0.75}$Sc$_{0.25}$ films in this study to well-known Al and Al$_{0.995}$Cu$_{0.005}$ films demonstrated how the addition of Sc into Al leads to a stronger film capable of higher operating temperatures. FIGS. 14A, 14B, and 14C illustrate the microstructures of a Ti/TiN/AlCu film (25/50/100 nm), an AlScN/Al film (100/100 nm), and a SiO$_2$/Al$_{0.75}$Sc$_{0.25}$ film (500/100 nm), respectively, after a 600° C. anneal in an Ar vacuum for 30 minutes. Although all three films exhibited resistivity values near their as-deposited state, microstructural defects are present in the AlCu and Al films that led to small increases in their resistivities. The Al$_{0.75}$Sc$_{0.25}$ film showed a smooth and pristine microstructure despite being deposited on SiO$_2$ at 25° C. and heated to 600° C. with resistivity improving due to crystallization of the Al$_3$Sc phase and recrystallization. When stacked films have dissimilar CTEs, thermal stresses induced during heating, for example an annealing process or high temperature operation, can lead to their electrical failure. The Al$_3$Sc films show a much higher tolerance to thermal induced stresses due to the strengthening Sc provides to Al when alloyed. Because the AlCu and Al films form defects after the 600° C. anneal, this demonstrates why the Al$_{0.75}$Sc$_{0.25}$ on SiO$_2$ is an impressive result given that the CTE of SiO$_2$ is ~29× lower than Al$_3$Sc (Al$_3$Sc/silica glass 16/0.55×10$^{-6}$° K$^{-1}$). See, Y. Harada and D. C. Dunand. This can be leveraged for applications requiring multiple layers that are stacked and/or heated together and expected to yield smooth interfaces between each stacked layer. For example, one such application is an acoustic Bragg reflector, which requires stacked layers of materials with dissimilar acoustic impedances.

Figure 15A:
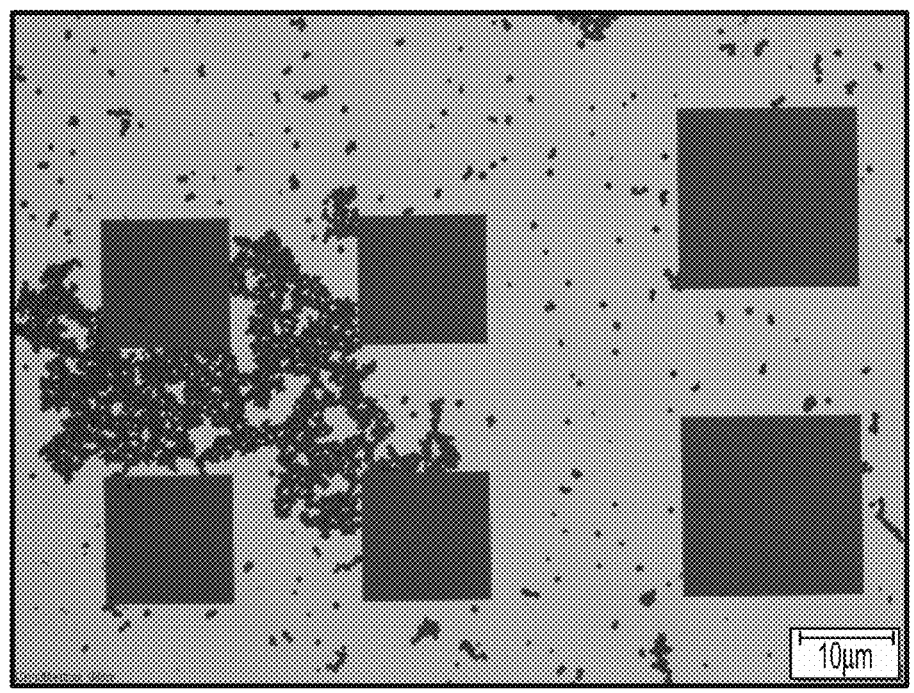
FIGS. 15A-B are microscope images of patterned samples in accordance with one or more embodiments of the present invention.
Figure 15B:
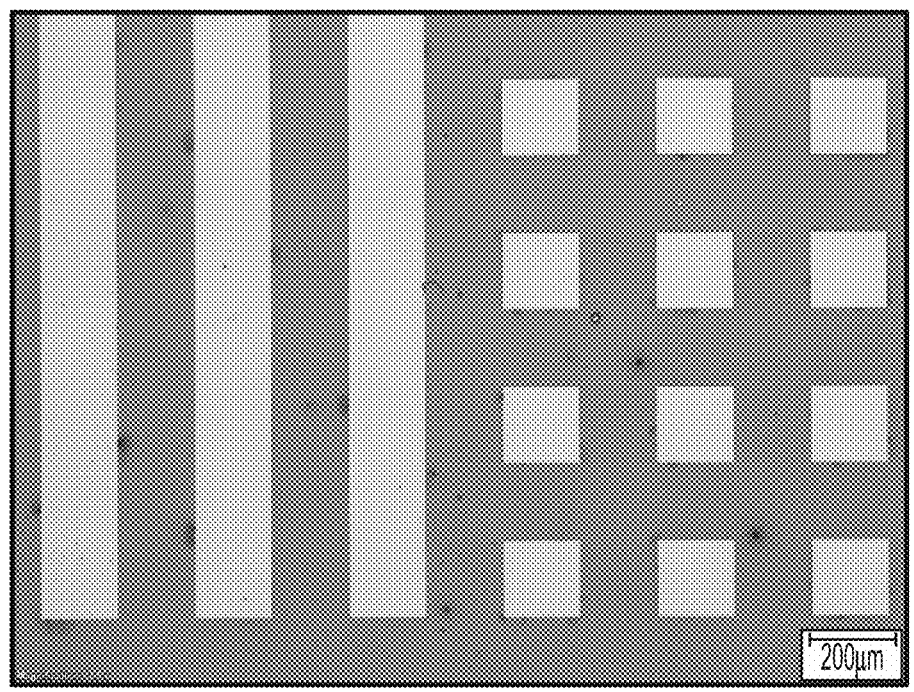
Figure 16A:
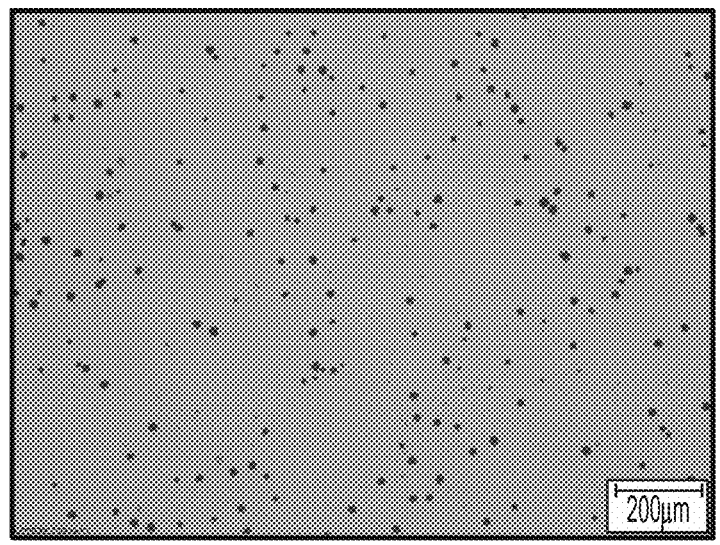
FIG. 16A-C are microscope images of structures in accordance with one or more embodiments of the present invention after being in a solution of 3.5 wt. % NaCl for 3 days.
Figure 16B:
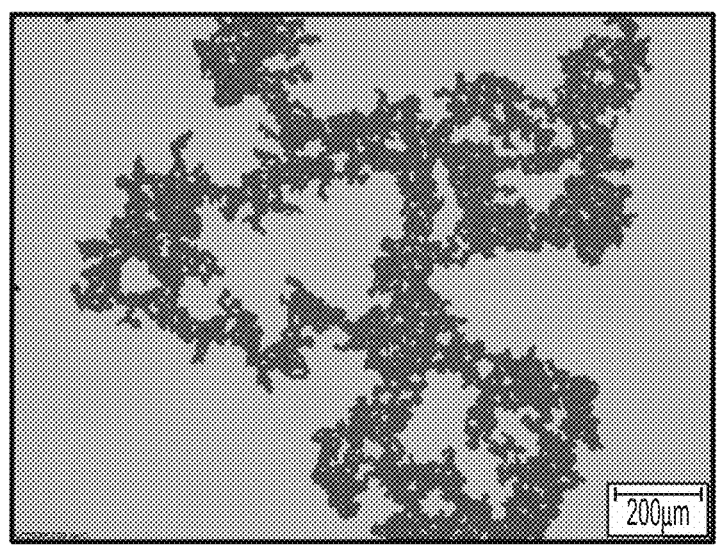
Figure 16C:
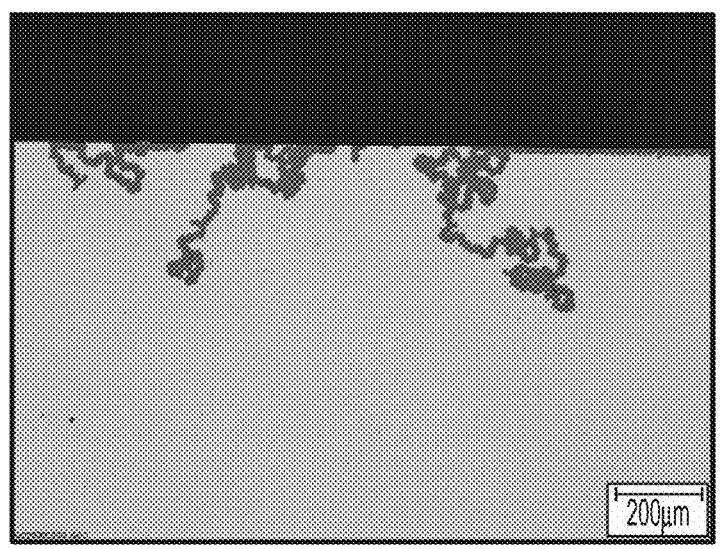

Exposing a patterned Al$_{0.75}$Sc$_{0.25}$ film deposited at 300° C. to a solution of 3.5 wt. % NaCl in deionized water for 24 hours allows for a qualitative examination of corrosion compared to Al films. FIG. 15A illustrates a patterned Al film that shows clear signs of corrosion near the patterned features. FIG. 15B illustrates a patterned Al$_{0.75}$Sc$_{0.25}$ film that displays a virtually pristine surface even after the 24-hour exposure to the 3.5 wt. % NaCl solution. These results match well with the literature. See, M. K. Cavanaugh et al.; and H.-L. Liao et al. However, the Al$_{0.75}$Sc$_{0.25}$ films are expected to have a much greater amount of the Al$_3$Sc phase than M. K. Cavanaugh et al. and H.-L. Liao et al., thereby providing further evidence that Al$_3$Sc is corrosion resistant. FIGS. 16A-16C are microscope images of three films that were exposed to 3.5 wt. % NaCl solution for 3 days. The Al sample in FIG. 16A showed clear signs of corrosion throughout the entire film, with the film displaying a slight haze due to the spots shown in FIG. 15A. The first Al$_{0.75}$Sc$_{0.25}$ sample, in FIG. 16B, was deposited at room temperature and also showed signs of corrosion but in a different form. This first $Al_{0.75}Sc_{0.25}$ sample is expected to have very little to no $Al_3Sc$ phase given that it was not annealed or deposited at a temperature ≥300° C. Meanwhile, the second $Al_{0.75}Sc_{0.25}$ sample, in FIG. 16C, was deposited at 300° C. and should have $Al_3Sc$ present, had a much greater resistance to corrosion from 3.5 wt. % NaCl solution. For this second $Al_{0.75}Sc_{0.25}$ sample, corrosion was only seen near the edges where the sample was cleaved, but not in the center of the piece. The second $Al_{0.75}Sc_{0.25}$ sample illustrated in FIG. 16C came from the same wafer that produced the sample illustrated in FIG. 15B, and demonstrates how the addition of Sc into Al leads to increased corrosion resistance. Higher amounts of $Al_3Sc$ phase appears to be critical to further improvements in corrosion resistance to NaCl, which can be achieved through a higher deposition temperature and/or a subsequent anneal.

The invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. A semiconductor device comprising:
 a substrate;
 an adhesion promoting layer on the substrate;
 a layer comprising 80% $Al_3Sc$ on the adhesion promoting layer, the layer comprising 80% $Al_3Sc$ having a crystallographic orientation of 111, the crystallographic orientation due to the adhesion promoting layer; and
 an active layer on the layer comprising 80% $Al_3Sc$.

2. The semiconductor device of claim 1, wherein the substrate includes one of a semiconductor wafer, a processed semiconductor wafer, an in-process semiconductor wafer, a composite wafer, or a cavity SOI wafer.

3. The semiconductor device of claim 1, wherein a thickness of the layer comprising 80% $Al_3Sc$ is between approximately 10 nm and approximately 10,000 nm.

4. The semiconductor device of claim 1, wherein the layer comprising 80% $Al_3Sc$ has a resistivity of approximately 150 μΩ-cm or less.

5. The semiconductor device of claim 4, wherein the layer comprising 80% $Al_3Sc$ has a resistivity of approximately 20 μΩ-cm or less.

6. The semiconductor device of claim 1, wherein the layer comprising 80% $Al_3Sc$ further includes:
 a layer of Sc.

7. The semiconductor device of claim 1, wherein the layer comprising 80% $Al_3Sc$ has a sloped-sidewall with an angle of approximately 10° to approximately 35° from a normal to a plane of the layer comprising 80% $Al_3Sc$.

8. The semiconductor device of claim 1, wherein the adhesion promoting layer includes at least one of AlN, $Al_{1-x}Sc_xN$, $Al_xGa_{1-x}N$, GaN, NbN, sapphire, Sc, SiN, Ta, TaN, Ti, TiN, or W.

9. The semiconductor device of claim 1, wherein a thickness of the adhesion promoting layer is between approximately 10 nm and approximately 150 nm.

10. The semiconductor device of claim 1,
 wherein the active layer includes $Al_{1-x}Sc_xN$; and
 wherein x is between 0.0 at. % and approximately 45 at. %.

11. The semiconductor device of claim 1, wherein the active layer includes at least one of Si, SiN, GaN, AlN, $Al_xGa_{1-x}N$, AlScN, or sapphire.

12. The semiconductor device of claim 1, wherein the active layer includes at least one of $SiO_2$, $Si_3N_4$, AlN, or a doped or undoped silicate glass.

13. The semiconductor device of claim 1, wherein at least a portion of the active layer has been removed down to the layer comprising 80% $Al_3Sc$.

14. The semiconductor device of claim 1, wherein the layer comprising 80% $Al_3Sc$ is adapted to resist plastic deformation induced by heating of the semiconductor device.

15. The semiconductor device of claim 1, wherein the semiconductor device is adapted to operate at temperatures up to at least 500° C.

* * * * *